United States Patent
Rasmussen et al.

(10) Patent No.: US 8,052,231 B2
(45) Date of Patent: Nov. 8, 2011

(54) BLANKING PANEL FOR EQUIPMENT RACK OR ENCLOSURE

(75) Inventors: Neil Rasmussen, Concord, MA (US); James S. Spitaels, Shrewsbury, MA (US); Jeffrey Lee Mattlin, St. Louis, MO (US); William Ziegler, Reading, MA (US)

(73) Assignee: American Power Conversion Corporation, West Kingston, RI (US)

( * ) Notice: Subject to any disclaimer, the term of this patent is extended or adjusted under 35 U.S.C. 154(b) by 229 days.

(21) Appl. No.: 12/369,462

(22) Filed: Feb. 11, 2009

(65) Prior Publication Data

US 2009/0178991 A1 Jul. 16, 2009

Related U.S. Application Data

(62) Division of application No. 10/966,620, filed on Oct. 15, 2004, now Pat. No. 7,506,768.

(51) Int. Cl.
*A47G 29/00* (2006.01)
*A47F 7/00* (2006.01)

(52) U.S. Cl. .......................... 312/265.6; 211/26; 211/183

(58) Field of Classification Search ............... 312/257.1, 312/263–265.6, 296, 297, 223.1, 223.2, 213, 312/236, 293.3; 211/26, 183, 41.1; 454/184; 361/679.33, 679.46, 724; 174/35 MS, 35 R, 174/35 GC, 66, 67
See application file for complete search history.

(56) References Cited

U.S. PATENT DOCUMENTS

| | | | |
|---|---|---|---|
| 3,120,166 A | | 2/1964 | Lyman |
| 3,240,862 A | * | 3/1966 | Merkl et al. .................. 174/371 |
| 4,673,090 A | | 6/1987 | Crosslen |
| 5,233,507 A | * | 8/1993 | Gunther et al. ............... 361/818 |
| 5,542,757 A | * | 8/1996 | Chang ......................... 312/223.2 |
| 5,770,822 A | * | 6/1998 | Abolitz et al. ................ 174/355 |
| 5,943,219 A | * | 8/1999 | Bellino et al. ................ 361/816 |
| 6,278,606 B1 | * | 8/2001 | Schmitt et al. ........... 361/679.35 |
| 6,281,433 B1 | | 8/2001 | Decker et al. |
| 6,462,944 B1 | | 10/2002 | Lin |

(Continued)

FOREIGN PATENT DOCUMENTS

EP 0 971 572 A1 12/2000

(Continued)

OTHER PUBLICATIONS

HP Invent, Filler Panel, Jan. 13, 2004, pp. 1.

(Continued)

*Primary Examiner* — Darnell Jayne
*Assistant Examiner* — Timothy M Ayres
(74) *Attorney, Agent, or Firm* — Lando & Anastasi, LLP

(57) ABSTRACT

A blanking panel is provided for use with equipment racks or enclosures that house electronic components, and is configured to facilitate installation of the panel with a pair of vertical mounting rails or flanges of a rack or enclosure without the use of tools or other hardware. The blanking panel is constructed of one or more materials and/or defines one or more configurations such that when the blanking panel is installed into a rack or enclosure, portions of a body of the blanking panel interface with a surface of an equipment component or another blanking panel installed above or below the blanking panel to thereby form an air seal there between, which helps to reduce or prevent hot exhaust air from mixing with cooling air within a rack or enclosure, and further helps to reduce or prevent cooling air from bypassing equipment components.

2 Claims, 21 Drawing Sheets

U.S. PATENT DOCUMENTS

| | | | |
|---|---|---|---|
| 6,527,351 B1 | 3/2003 | Sevier et al. | |
| 6,547,348 B2 * | 4/2003 | Craft et al. | 312/263 |
| 6,616,005 B1 * | 9/2003 | Pereira et al. | 220/241 |
| 6,695,149 B1 | 2/2004 | Cote et al. | |
| 6,758,353 B2 | 7/2004 | Orr | |
| 6,826,057 B1 | 11/2004 | Gundogan et al. | |
| 6,865,092 B2 * | 3/2005 | Joist et al. | 361/818 |
| 6,924,977 B2 | 8/2005 | Bestwick et al. | |
| 7,506,768 B2 | 3/2009 | Rassmussen et al. | |
| 2002/0153338 A1 | 10/2002 | Orr | |
| 2003/0030975 A1 | 2/2003 | Bestwick et al. | |
| 2003/0030988 A1 | 2/2003 | Garnett et al. | |
| 2003/0030989 A1 | 2/2003 | Kitchen et al. | |
| 2003/0030990 A1 | 2/2003 | King et al. | |
| 2003/0030993 A1 | 2/2003 | Kitchen et al. | |
| 2003/0031187 A1 | 2/2003 | Heffernan et al. | |
| 2004/0232098 A1 | 11/2004 | Orr | |
| 2006/0081545 A1 | 4/2006 | Rassmussen et al. | |
| 2006/0256534 A1 | 11/2006 | Garnett et al. | |

FOREIGN PATENT DOCUMENTS

| | | |
|---|---|---|
| EP | 1 322 008 A1 | 6/2003 |

OTHER PUBLICATIONS

HP Invent, Technical Data Sheet, J1514A—HP Filler Panels, Pack of 6, quartz, pp. 1.

HP Invent, Technical Data Sheet, J1524A—HP Filler Panels, Pack of 100, quartz, pp. 1.

International Search Report for PCT/US2005/037160 mailed Apr. 12, 2006.

* cited by examiner

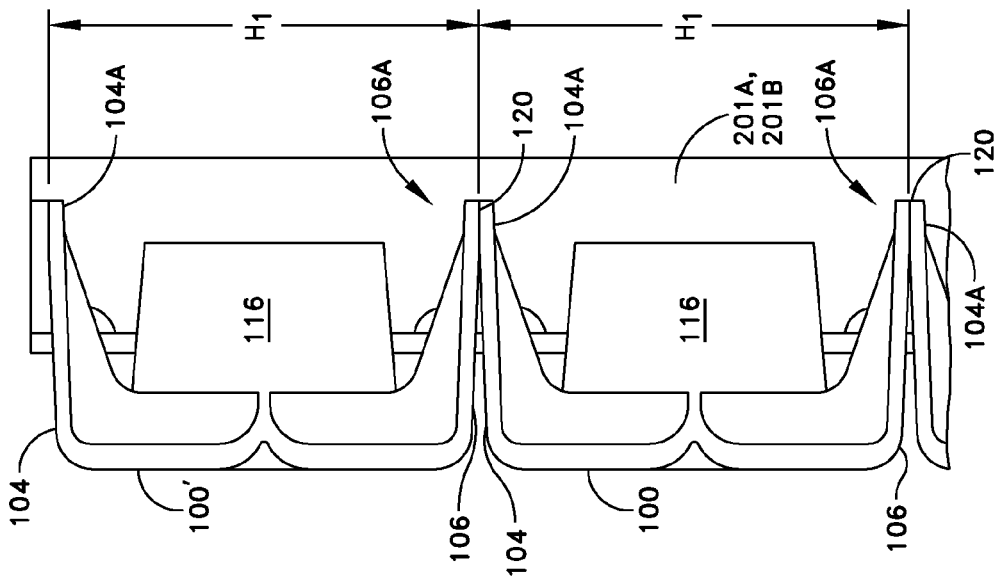
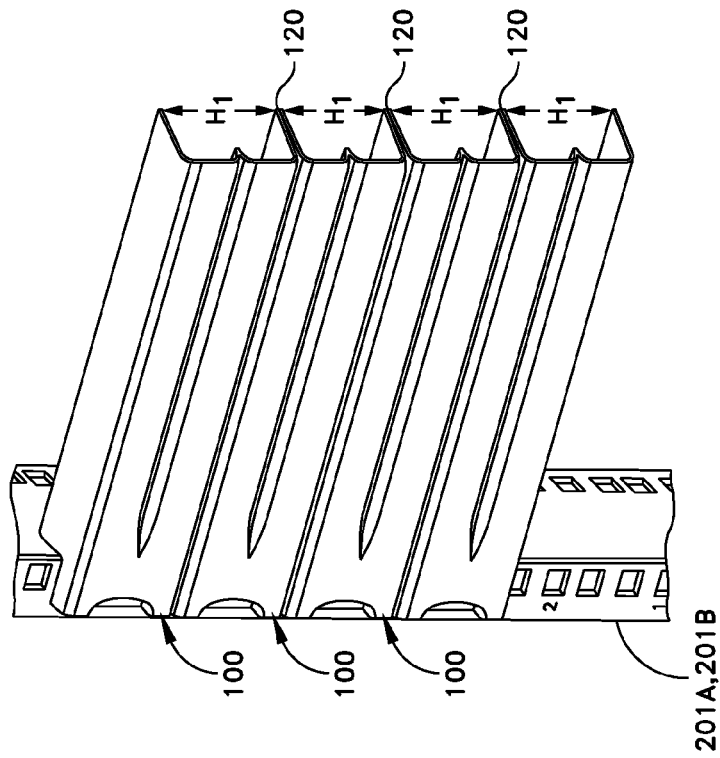
FIG. 8A
FIG. 8B

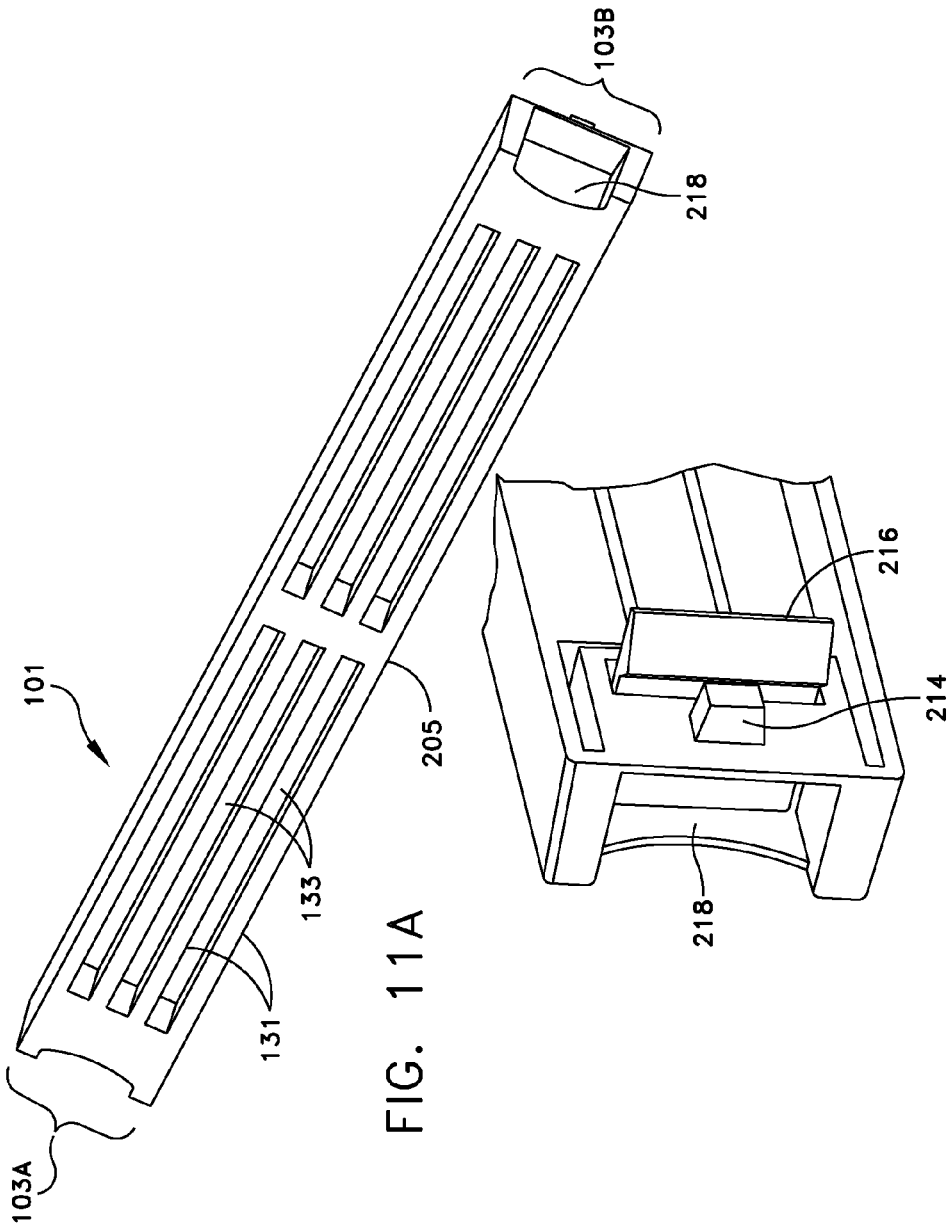

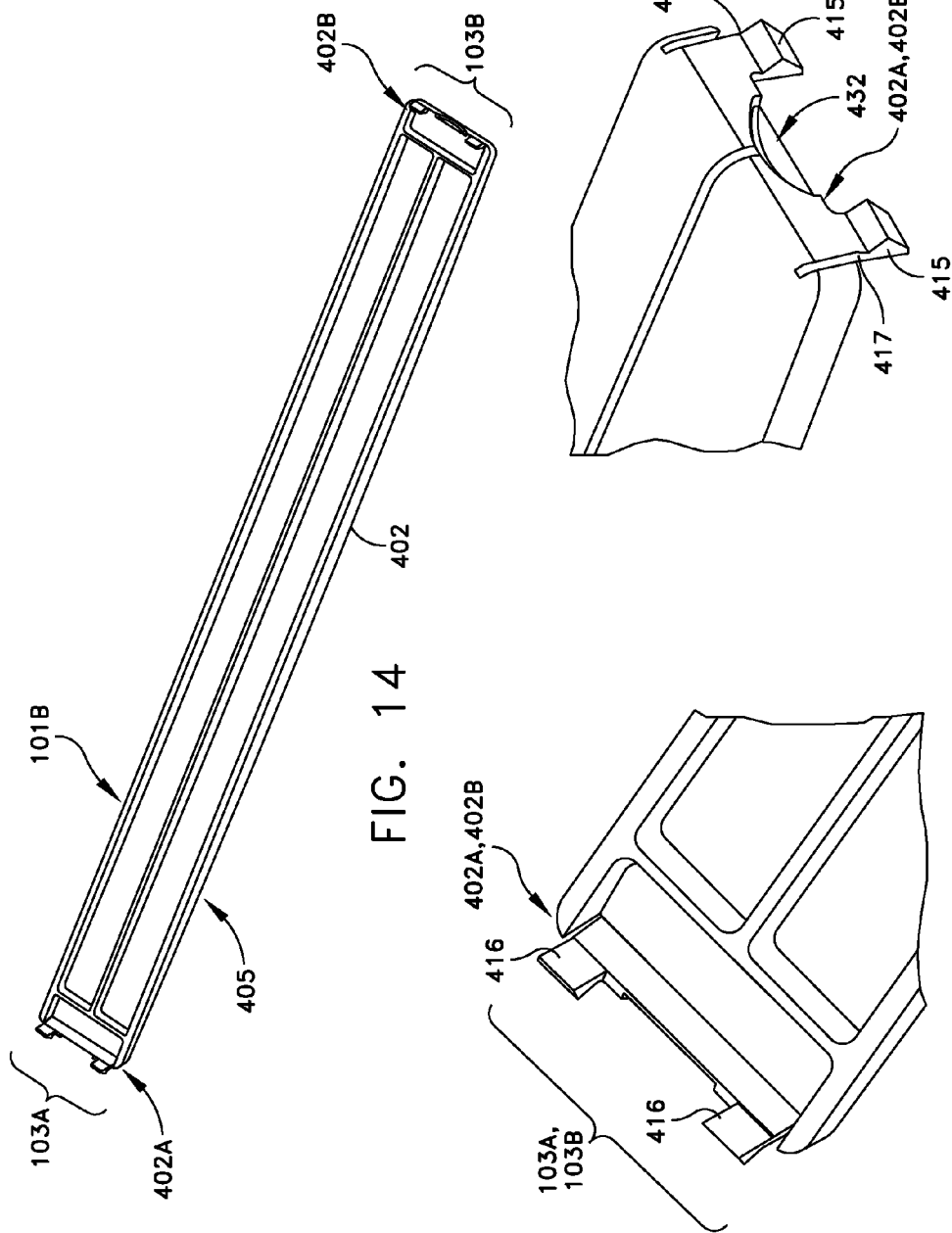

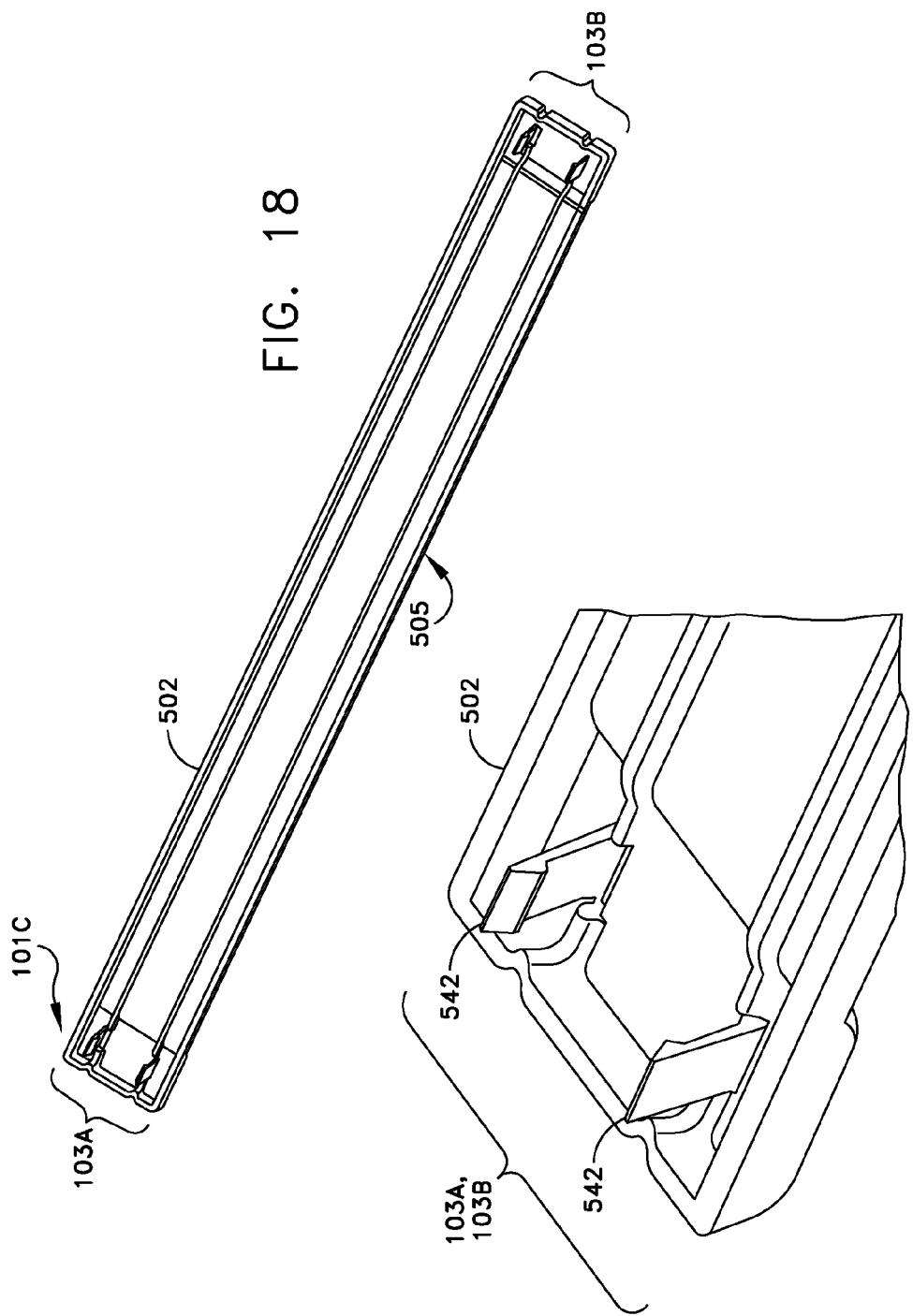

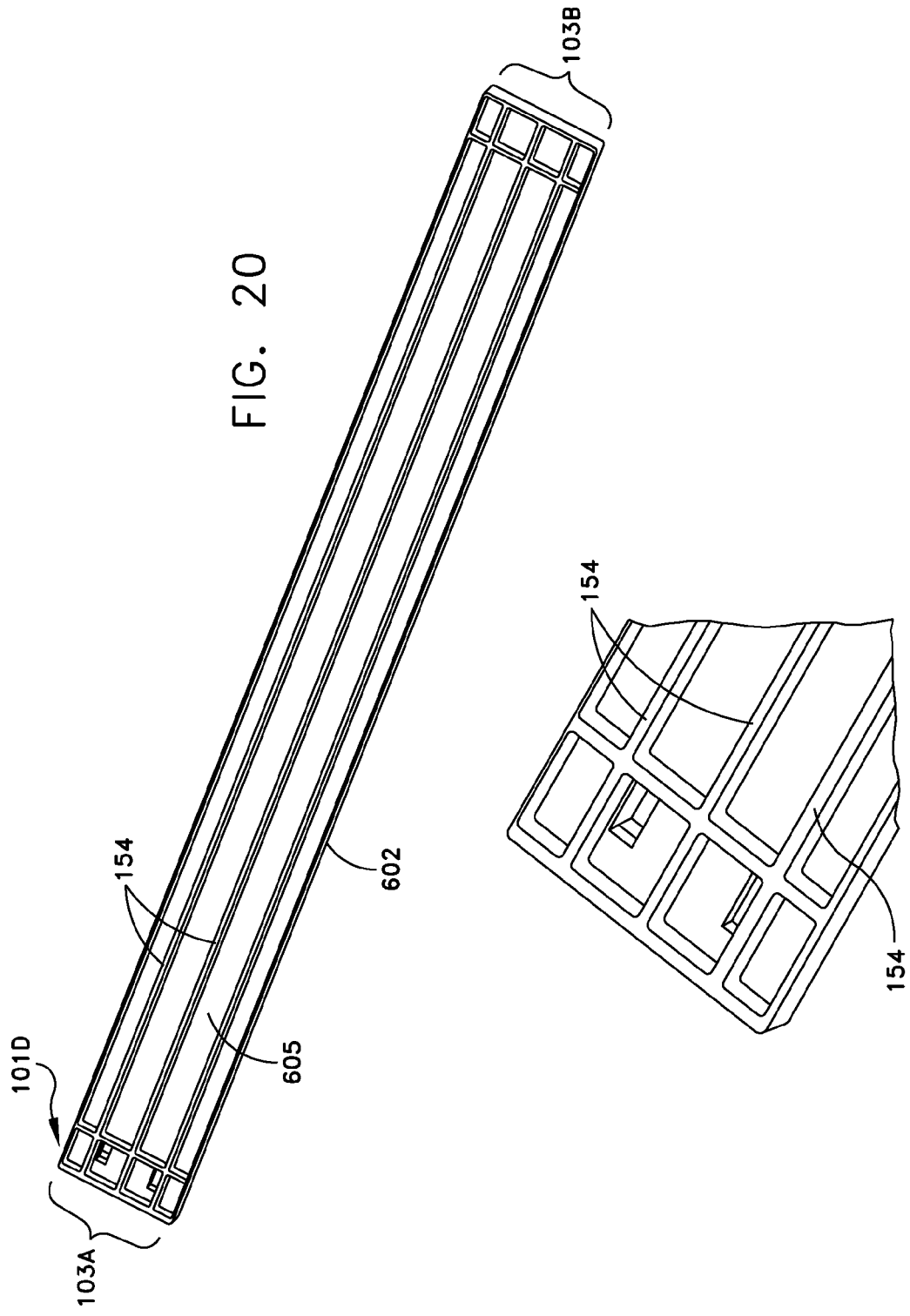

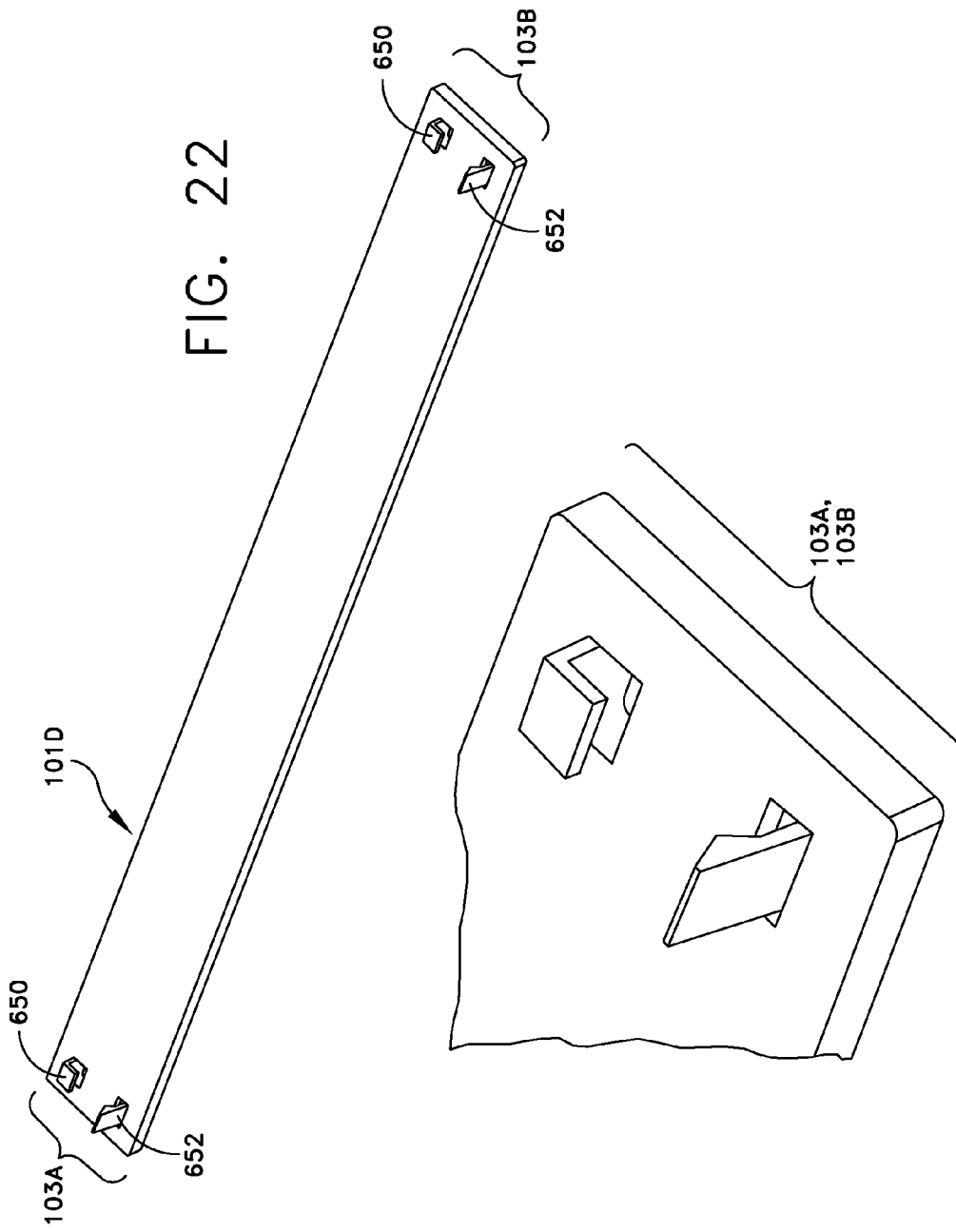

BLANKING PANEL FOR EQUIPMENT RACK OR ENCLOSURE

RELATED APPLICATIONS

This application is a divisional of U.S. patent application Ser. No. 10/966,620, filed Oct. 15, 2004 now U.S. Pat. No. 7,506,768, and entitled BLANKING PANEL FOR EQUIPMENT RACK OR ENCLOSURE, which is incorporated herein by reference in its entirety.

FIELD OF THE INVENTION

A filler or blanking panel is provided for use with an equipment rack or enclosure.

BACKGROUND OF THE INVENTION

Equipment racks and enclosures for housing electronics help to integrate a variety of different types of equipment including servers, networking equipment, power supplies, storage systems and other electronics equipment, as well as help to configure and manage an IT environment. Availability and flexibility with respect to configuring a rack environment and, in particular, with respect to reconfiguring or relocating an installed rack are essential for efficient and practical management of equipment rooms and data centers. In many instances, equipment racks and enclosures are not fully configured from top to bottom with rack-mounted components, resulting in vacant sections of an equipment area defined by the rack or enclosure. Typically, blanking panels are attached to mounting flanges or rails of a rack or enclosure to block or fill-in such sections lacking equipment.

Prior art blanking panels generally include panels configured to attach to mounting flanges or rails of a rack or enclosure with fasteners such as screw and nut combinations. Proper installation of a number of blanking panels during configuration of an equipment rack can be inconvenient, time-consuming and difficult as a result of the number of screw and nut combinations that need to be manipulated to attach or to remove several blanking panels.

Prior art blanking panels may be configured with a height of several U; however, large blanking panels do not necessarily provide convenience or flexibility with respect to configuring and rearranging an equipment rack. While the coverage provided by large blanking panels gives end-users an incentive to use large panels in populating a rack, when these panels are removed to reconfigure a rack, end-users would need to locate and install a sufficient number of smaller blanking panels that collectively measure the exact U height required to fill-in the vacant spaces, created as a result of removing large blanking panels, and/or installing, removing or rearranging equipment components. Installation of blanking panels to reconfigure or rearrange a rack can be similarly time-consuming and difficult.

Other prior art designs permit blanking panels to be installed into a rack or enclosure without the use of tools or hardware. However, such prior art panel designs are configured primarily for aesthetic purposes in order for panels to conform to the external appearance of installed equipment components. Such blanking panels are not configured, for instance, to reduce or eliminate gaps between installed blanking panels and equipment components and, therefore, have little or no effect in preventing mixing of hot exhaust air with cooling air within a rack. Any effect such designs have on air circulation is minimal and merely consequential.

Many blanking panels are constructed in whole or in part of metal. Such designs are relatively expensive to manufacture and to ship. In addition, metal blanking panels are prone to scratching and other surface abrasion, and can be easily bent during shipping, handling and installation.

SUMMARY OF THE INVENTION

An object of the invention includes providing an improved blanking panel for use in an equipment rack or enclosure.

Another object of the invention includes providing a blanking panel configured to form an air seal between adjacent blanking panels and equipment components when installed into a rack or enclosure to help to reduce or prevent mixing of hot exhaust air with cooling air.

A further object of the invention includes providing a blanking panel configured to form an air seal between adjacent blanking panels and equipment components installed in a rack or enclosure above or below the blanking panel that helps to reduce or prevent cooling air from flowing past or bypassing equipment components and thereby helps to insure cooling air is forced or drawn into the equipment components.

Still another object of the invention includes providing a blanking panel with a desired U height and configuration that help to accommodate variances in U height of equipment components and other blanking panels with which the blanking panel is installed, and which also help to accommodate variances in U height of vacant sections within a rack or enclosure created as a consequence of removing equipment components and other blanking panels.

Yet another object of the invention includes providing a blanking panel configured for tool-less installation into a rack or enclosure.

A further object of the invention includes providing a lightweight blanking panel that may be manufactured and shipped at lower costs.

In general, in an aspect, the invention provides a blanking panel for use with an equipment rack or enclosure, the blanking panel comprising an elongated body constructed and arranged to install the blanking panel in a substantially horizontal orientation between a pair of mounting rails of an equipment rack or enclosure including a first side wall and a second opposing side wall, and a front wall connecting the first side wall with the second side wall. The blanking panel further comprises an attachment configuration disposed along each end of the elongated body. The attachment configuration is constructed and arranged to facilitate tool-less installation and removal of the blanking panel with a pair of mounting rails. The blanking panel also comprises at least a portion of the first side wall and at least a portion of the second side wall constructed to interface with a portion of one of an equipment component and a second blanking panel installed within the equipment rack or enclosure adjacent to and above or below the blanking panel to form an air seal therebetween.

Implementations of the invention may include one or more of the following features. The air seal is disposed and is configured to at least restrict flow of air between one of the portion of the first side wall and the portion of the second side wall and the portion of one of the adjacent equipment component and the adjacent second blanking panel. The air seal is disposed and is configured to at least restrict mixing of hot exhaust air with available cooling air within an equipment rack or enclosure. The air seal extends horizontally along a span of the blanking panel installed between a pair of mounting rails. The portion of the first side wall and the portion of the second side wall are constructed of one or more materials that permit the portions to one of deflect, flex and compress in response to an application of force or pressure. The one or more materials include one or more materials selected from the group consisting of a plastic, a rubber, a metal and any combinations thereof.

Implementations of the invention may further include one or more of the following features. The elongated body of the blanking panel defines a height between the first side wall and the second side wall that measures in excess of a height allowed by the EIA-310 standard such that the portion of the first side wall and the portion of the second side wall interfere with the portion of one of the adjacent equipment component and the adjacent second blanking panel, wherein the adjacent equipment component and the second blanking panel define an actual height that conforms to the EIA-310 standard.

The elongated body is further constructed and arranged such that when the blanking panel is installed horizontally between a pair of mounting rails, the blanking panel covers one or more mounting apertures defined along one or both of the pair of mounting rails. The elongated body is further constructed and arranged such that when the blanking panel is installed horizontally between a pair of mounting rails, one or more U height markings displayed along one or both of the pair of mounting rails are visible. The at least one of the attachment configurations defines a finger grip, the finger grip being disposed and configured to facilitate tool-less removal of the blanking panel from a pair of mounting rails.

Each attachment configuration includes one or more retention tabs, each retention tab being configured and disposed to facilitate tool-less installation and removal of the blanking panel to a pair of mounting rails. Each retention tab is constructed and arranged to securely and releasably engage with one of a pair of mounting rails.

Each attachment configuration further includes one or more alignment pegs disposed along an inner surface of the elongated body, each alignment peg being configured such that one of a plurality of mounting apertures defined along one of a pair of mounting rails receives at least a portion of the alignment peg. Each alignment peg is further disposed and spaced in relation to other alignment pegs to permit the blanking panel to be installed at a substantially horizontal orientation between a pair of mounting rails.

In addition, the elongated body has an external surface similar to an external surface of at least one of an equipment component and a second blanking panel.

In another aspect, the invention provides a blanking panel for use with an equipment rack or enclosure, the blanking panel comprising an elongated body constructed and arranged to install the blanking panel in a substantially horizontal orientation between a pair of mounting rails of an equipment rack or enclosure, and further constructed and arranged to interface with one of an adjacent equipment component and an adjacent blanking panel when installed above or below the blanking panel within an equipment rack or enclosure to form an air seal between the elongated body and one of the adjacent equipment component and the adjacent blanking panel. The blanking panel further comprises an attachment configuration disposed along each end of the elongated body. The attachment configuration is constructed and arranged to facilitate tool-less installation and removal of the blanking panel to a pair of mounting rails.

In a further aspect, the invention provides a blanking system for covering vacant sections of an equipment rack or enclosure, the blanking system comprising a plurality of blanking panels. Each blanking panel is joined to an adjacent blanking panel and includes an elongated body constructed and arranged to install the blanking system in a substantially horizontal orientation between a pair of mounting rails of an equipment rack or enclosure, an attachment configuration disposed along each end of the elongated body, the attachment configuration being constructed and arranged to facilitate tool-less installation and removal of the blanking panel to a pair of mounting rails, and at least a portion of the elongated body being constructed to interface with a portion of one of an equipment component and a second blanking panel when installed adjacent to the blanking panel within an equipment rack or enclosure to form an air seal therebetween.

In yet another aspect, the invention provides a method of filling in one or more vacant sections of an equipment rack, the method comprising providing an elongated body constructed and arranged to be disposed in a substantially horizontal orientation between a pair of mounting rails of an equipment rack, and inserting an elongated body into a vacant section of the equipment rack or enclosure. The method further comprises deflecting at least a portion of an upper wall of the elongated body and deflecting at least a portion of a lower wall of the elongated body in response to an application of force, wherein the application of force results from inserting the elongated body between one of an equipment component and a blanking panel installed in the equipment rack above and below the vacant section, and forming an air seal between the deflected portion of the upper wall and the deflected portion of the lower wall of the elongated body.

Various aspects of the invention may provide one or more of the following capabilities. A filler or blanking panel can be configured for use with an equipment rack or enclosure to fill vacant sections of an equipment area within a rack or enclosure. A blanking panel can be configured to readily and quickly mount to standard mounting flanges or rails without requiring hardware or tools for installation. One or more blanking panels can be attached to rails above and/or below rack-mounted equipment components to dispose the panels horizontally between adjacent flanges or rails and to thereby fill vacant gaps and sections of the equipment area.

A blanking panel can be configured such that the panel can be installed with and removed from a rack without requiring vertical movement of the panel and also without requiring the panel to be gripped from above or below, or from inside a rack or enclosure. The panel, therefore, can be installed into a rack or enclosure without removing or disturbing existing equipment components disposed above and below the panel location. The blanking panel can be further configured such that pulling or pushing the panel along a front wall and/or along a side edge helps to install or remove the panel, while avoiding vertical movement of the panel. In addition, a blanking panel can define a configuration and a 1U height that helps to provide flexibility and efficiency with respect to filling-in vacant sections of an equipment rack during configuration and/or rearrangement of an equipment rack or enclosure.

A blanking panel can be configured to create an air seal when installed into a rack or enclosure adjacent to other blanking panels and/or equipment components. The blanking panel can be configured to create an air seal at an interface of at least a portion of a surface of the blanking panel and a portion of a surface of an adjacent blanking panel or equipment component. The air seal helps to reduce or prevent mixing of hot exhaust air with cooling air within a rack or enclosure. In particular, the air seal helps to reduce or prevent hot exhaust air, e.g., air vented from equipment components at elevated temperatures, from recirculating from an exhaust surface of a rack to an air intake surface of the rack and mixing with available cooling air. In addition, the air seal formed between the blanking panel and adjacent panels and equipment components installed in a rack or enclosure above or below the blanking panel helps to reduce or prevent cooling air from flowing past or bypassing equipment components and thereby helps to insure that cooling air is forced or drawn into the equipment components.

Further, a blanking panel can be configured to cover mounting holes or apertures defined along mounting flanges or rails when the blanking panel is installed into a rack or enclosure. Covering mounting holes or apertures helps to reduce or prevent mixing of hot exhaust air with cooling air. The blanking panel may thereby help to increase or maximize the effectiveness of available cooling air within a rack or enclosure.

A blanking panel can be constructed in whole or in part of one or more materials suitable for imparting deflection properties to portions of a body of the blanking panel that help to facilitate installation and help to form an air seal between the blanking panel and adjacent panels or equipment components. The body of the blanking panel may include a top wall and a bottom wall with a front wall disposed therebetween. Portions of the top wall and the bottom wall, e.g., edge portions, may be constructed of one or more materials that help to permit the portions of the top and bottom walls to deflect when the blanking panel is inserted between panels or equipment components for installation. For instance, where the blanking panel is installed between a pair of blanking panels or equipment components, the edge portions of the top and bottom walls deflect in response to force or pressure applied to the walls as a consequence of inserting the blanking panel between the panels or components. The deflection properties of the top and bottom wall edge portions also help to insure that at least the edge portions interface with a surface of an adjacent blanking panel or equipment component to help to create an air seal.

In other instances, the entire top wall and/or the entire bottom wall of the blanking panel body are constructed of one or more suitable materials for providing the walls with such deflection properties as described above to help to facilitate installation and formation of an air seal between the walls and adjacent panels and equipment.

In still further instances, one or more sections of the body of the blanking panel, e.g., a front wall, a top wall, a bottom wall or certain portions thereof, may be constructed of one or more materials and/or may define one or more configurations suitable for providing deflection properties, flexibility and/or compression abilities to the blanking panel body that help to install the blanking panel and/or help to form an air seal as described above.

Alternatively, in other instances, the blanking panel body may include relatively rigid top and bottom walls that define along respective edge portions one or more configurations that help to form an interface between the blanking panel and adjacent panels and equipment components when the blanking panel is installed. For instance, such configurations may include, but are not limited to, gasket-type or O-ring configurations disposed along edge portions of the panel body that form an interface between a portion of a surface of the panel body and a surface of an adjacent panel or component to help to create an air seal as described above.

A blanking panel can include an external surface or a front panel or wall having a configuration and surface appearance that is consistent with the rack environment within which the panel is installed. For instance, the external surface of the front wall may be substantially similar or relatively uniform in appearance with the external front panel surfaces of equipment components and other types of blanking panels installed in a rack or enclosure. The configuration and appearance of the panel front wall helps to provide the mix of components and panels with a simple and relatively uniform appearance, and also helps to minimize the appearance of gaps between the blanking panel and adjacent equipment components and panels. As a result, the blanking panel may improve the aesthetic appearance of the rack configuration.

A blanking panel can include an elongated panel body and an attachment configuration disposed along each end of the panel body. Each attachment configuration can be constructed and arranged to permit tool-less installation and removal of the panel. The panel body can further include a finger grip disposed along each end of the panel body to further facilitate tool-less installation and removal. For instance, each finger grip can be constructed and arranged to receive at least a portion of one or more user fingers, a tool or other implement with which a user employs to apply force or pressure to push the panel against the mounting flanges or rails to engage the attachment configurations with the flanges or rails and to thereby install the panel. Each finger grip is similarly used to pull the panel from the flanges or rails to disengage the attachment configurations to remove the panel from a rack.

Attachment configurations include one or more retention tabs, retention hooks, alignment pegs, and any combinations thereof, which help to securely and releasably install the blanking panel into a rack or enclosure. In addition, retention tabs, retention hooks and/or alignment pegs may be configured and disposed to help to align the panel with mounting holes or apertures defined along flanges or rails of a rack or enclosure to help to insure proper installation and to help to avoid crooked installation of the panel. Further, the retention tabs, retention hooks, and/or alignment pegs may be further configured and disposed to help to accommodate variations in the dimensions and the configurations or shapes of mounting apertures, as well as variations in distances between mounting apertures, such that the blanking panel may be used with a variety of rack or enclosure designs.

The retention tabs and hooks may be still further configured and disposed to couple to or to mate with, e.g., to bias against, a portion of a surface of a mounting flange or rail, or a portion of a perimeter edge defining a mounting aperture, to help to releasably secure the panel in a rack or enclosure.

Attachment configurations can be constructed and arranged such that one or more blanking panels can be installed into an assembled equipment rack or enclosure, and thereafter shipped with the assembled rack or enclosure to an end-user for use without the blanking panels becoming detached from the rack or enclosure in transit.

A blanking panel can be constructed and arranged such that when installed into a rack or enclosure, the blanking panel permits U height indications and demarcations displayed along mounting flanges or rails of the rack or enclosure to be visible. Visible U height indications help to prevent errors in mounting and installing equipment components and blanking panels into a rack or enclosure.

A blanking panel can be constructed and arranged to define any height, e.g., 1U, 2U, 3U, 4U, etcetera, or any fractional U height, to help to provide flexibility and convenience with respect to configuring a rack or enclosure and filling-in vacant sections of the rack or enclosure. In particular, a blanking panel with a nominal 1U height helps to optimize flexibility and convenience. One or more 1U blanking panels may be easily and quickly installed into and removed from a rack to fill-in vacant sections created as a result of reconfiguring or rearranging the rack and to thereby accommodate vacant sections having any U height. In addition, using 1U blanking panels eliminates the need to locate a sufficient number and variety of blanking panels that collectively have the specific U height needed to fill-in a vacant section. The 1U blanking panel can thereby help to provide efficiency during installation of equipment components and configuration of a rack.

These and other capabilities of the invention, along with the invention itself, will be more fully understood after a review of the following figures, detailed description, and claims.

BRIEF DESCRIPTION OF THE DRAWINGS

FIG. 8A is a cross-sectional perspective view of the multiple of blanking panels shown in FIG. 7;

FIG. 8B is a cross-sectional view of several adjacent blanking panels mounted to a vertical mounting rail of an equipment rack and an interface between the blanking panels;

FIG. 11A is a perspective view of a blanking panel according to another aspect of the invention;

FIG. 11B is a perspective view of the rear side of one end of the blanking panel shown in FIG. 10;

FIG. 14 is a perspective view of the rear side of a blanking panel according to a further aspect of the invention;

FIG. 15 is a perspective view of the rear side of one end of the blanking panel shown in FIG. 14;

FIG. 16 is a perspective view of the front side of the end of the blanking panel shown in FIG. 14;

FIG. 18 is a perspective view of the rear side of a blanking panel according to yet another aspect of the invention;

FIG. 19 is a perspective view of the rear side of one end of the blanking panel shown in FIG. 18;

FIG. 20 is a perspective view of a blanking panel according to a further aspect of the invention;

FIG. 21 is a perspective view of one end of the blanking panel shown in FIG. 20;

FIG. 22 is a perspective view of the rear side of the blanking panel shown in FIG. 20;

FIG. 23 is a perspective view of the rear side of one end of the blanking panel shown in FIG. 22.

DETAILED DESCRIPTION OF PREFERRED EMBODIMENTS

Figure 1:
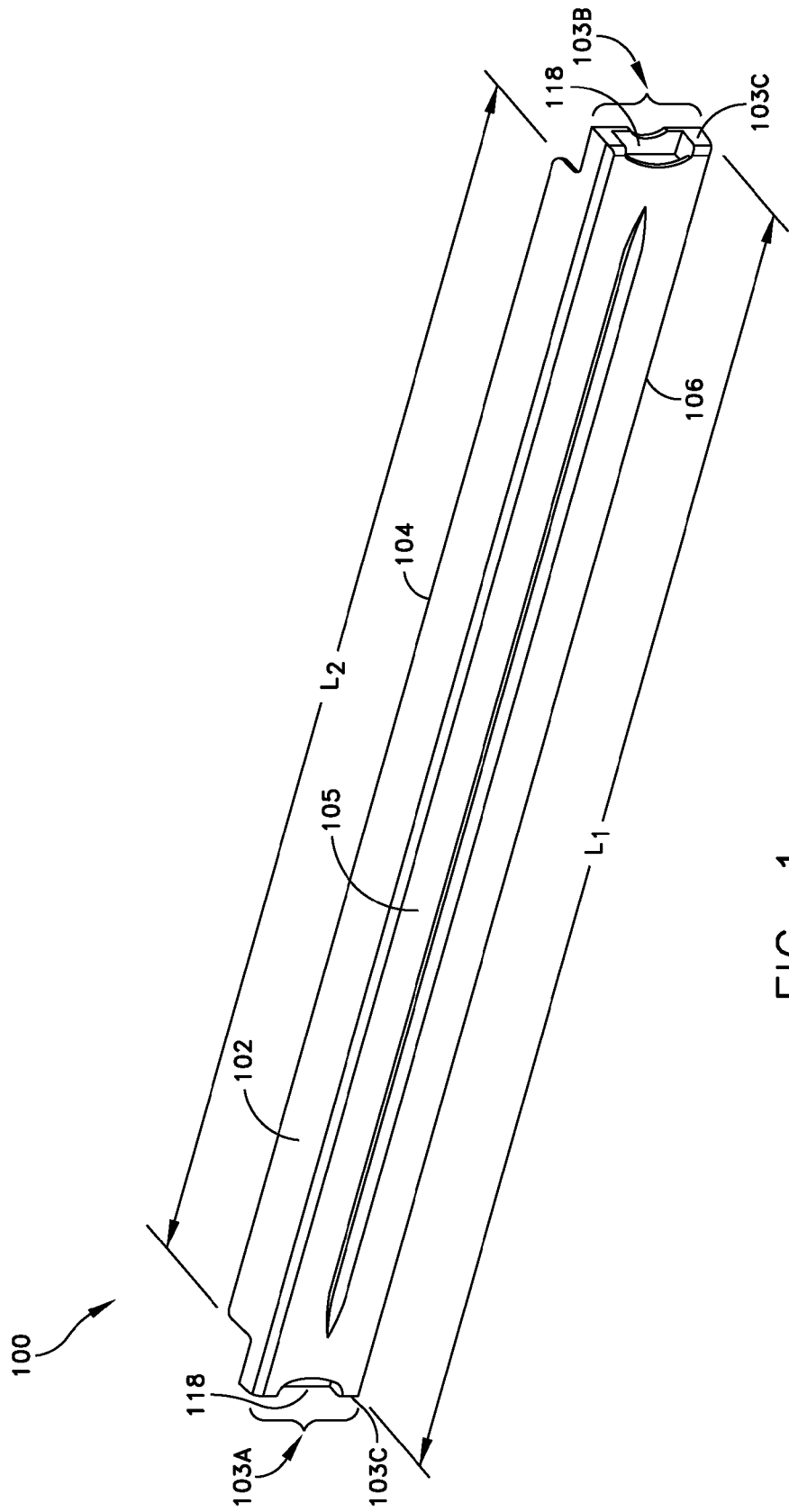
FIG. 1 is a perspective view of a blanking panel according to an aspect of the invention.

Embodiments of the invention provide a filler or blanking panel configured for attachment to vertical mounting flanges or rails of an equipment rack or enclosure used to contain equipment including servers, networking equipment, information technology equipment, communications equipment and other electronic components. The blanking panel includes an elongated panel body defining along each end an attachment configuration. Each attachment configuration is constructed and arranged to facilitate tool-less installation and removal of the blanking panel to a pair of adjacent vertical mounting flanges or rails of an equipment rack or enclosure. Each attachment configuration may include one or more retention tabs, retention hooks, alignment pegs, or one or more similar configurations, and any combinations of such tabs, hooks, pegs and configurations. The retention tabs, hooks, and alignment pegs are constructed and arranged to facilitate tool-less installation and removal of the blanking panel, and to help to releasably secure the blanking panel to a pair of mounting flanges or rails.

In addition, the retention tabs, retention hooks and alignment pegs are disposed along the blanking panel and are further configured such that the panel can be mounted to and removed from a rack without requiring vertical movement of the panel, or without requiring the panel to be gripped or otherwise manipulated from above or below the panel, or from inside a rack or enclosure. The attachment configurations thereby permit the blanking panel to be added to or removed from a rack without disturbing or removing equipment or other blanking panels previously installed within the rack.

The blanking panel is configured and sized to block a section of an equipment area within a rack or enclosure. In addition, the blanking panel is constructed and arranged to help to create an air seal at an interface of the blanking panel and a second blanking panel (according to the invention), another type of blanking panel, or an equipment component installed in a rack or enclosure adjacent to the blanking panel. The construction and arrangement of the blanking panel also helps to form an air seal at an interface of the blanking panel and an end-frame disposed adjacent to the blanking panel along a top or a bottom of a rack or enclosure.

The air seal helps to reduce or prevent mixing of hot exhaust air, e.g., air vented from equipment components at elevated temperatures, from mixing with cooling air within a rack or enclosure. In addition, the air seal helps to reduce or prevent cooling air from flowing past or bypassing equipment components and thereby helps to insure that cooling air is forced or drawn into the equipment components.

The blanking panel is also constructed and arranged to cover one or more mounting apertures or holes defined along mounted flanges or rails when installed into a rack or enclosure to further help to reduce or prevent mixing of exhaust and cooling air and to further help to insure that cooling air is forced or drawn into equipment components. The blanking panel configuration may thereby help to increase or maximize the effectiveness of available cooling air within a rack or enclosure.

Further, the blanking panel includes an external surface or a front panel or wall that resembles or is substantially similar to the external surfaces or front panels of equipment components. Where one or more blanking panels are installed in a rack or enclosure above and/or below equipment components, the blanking panels help to create a relatively consistent facade of the mix of equipment components and blanking panels and thereby help to provide an improved aesthetic appearance of the rack configuration. The configuration and size of the blanking panel further helps to minimize the appearance of gaps between adjacent blanking panels, and at interfaces between the blanking panel and adjacent equipment components.

The blanking panel may define any U height, e.g., 1U, 2U, 3U, 4U, etcetera, or fractional U height, and preferably defines a 1U height. A 1U blanking panel helps provide convenience and flexibility with respect to installation and removal of blanking panels during configuration or rearrangement of a rack. One or more blanking panels having a 1U height are readily and easily installed into or removed from a rack to help to configure or rearrange the rack without the addition or removal of any more panels or equipment components than necessary. Other embodiments are within the scope of the invention.

Figure 2:
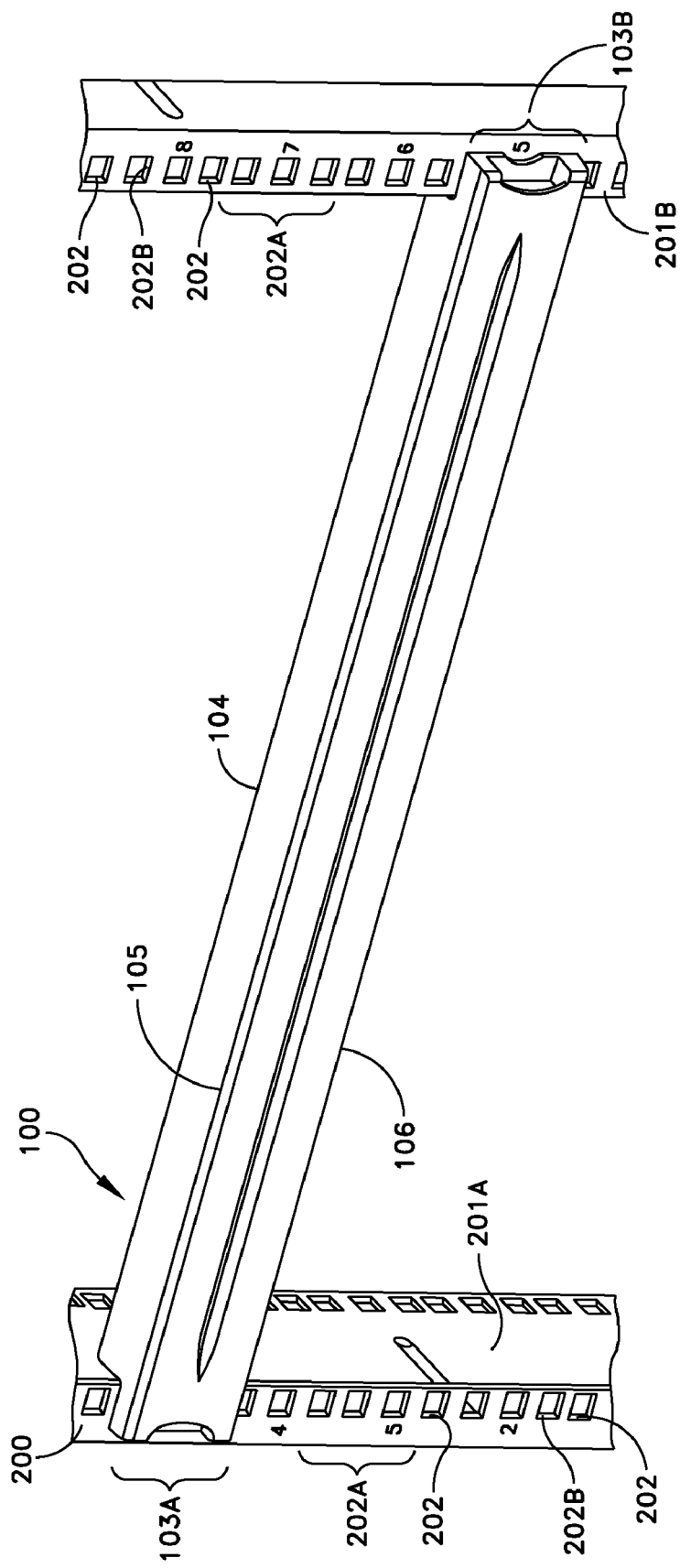
FIG. 2 is a perspective view of the blanking panel shown in FIG. 1 mounted to a pair of vertical mounting rails of an equipment rack.

Referring to FIGS. 1 and 2, a filler or blanking panel 100 includes an elongated panel body 102 having disposed at each end an attachment configuration 103A and 103B. The attachment configuration 103A and 103B is constructed and arranged to attach or mount the panel 100 between a pair of adjacent vertical mounting flanges or rails 201A and 201B of an equipment rack or rack enclosure 200. The body 102 has a length $L_1$ sufficient to span a distance between the pair of mounting rails 201A and 201B such that the blanking panel 100 is mounted horizontally between the rails 201A and 201B. The length $L_1$ of the panel body 102 can include any length that is sufficient to horizontally mount the panel 100 between a pair of rails 201A and 201B of any rack or enclosure size or design. In particular, the panel body 102 can define a length $L_1$ sufficient to mount the panel 100 between pairs of rails 201A and 201B of a 19-inch or a 23-inch equipment rack 200.

Figure 3:
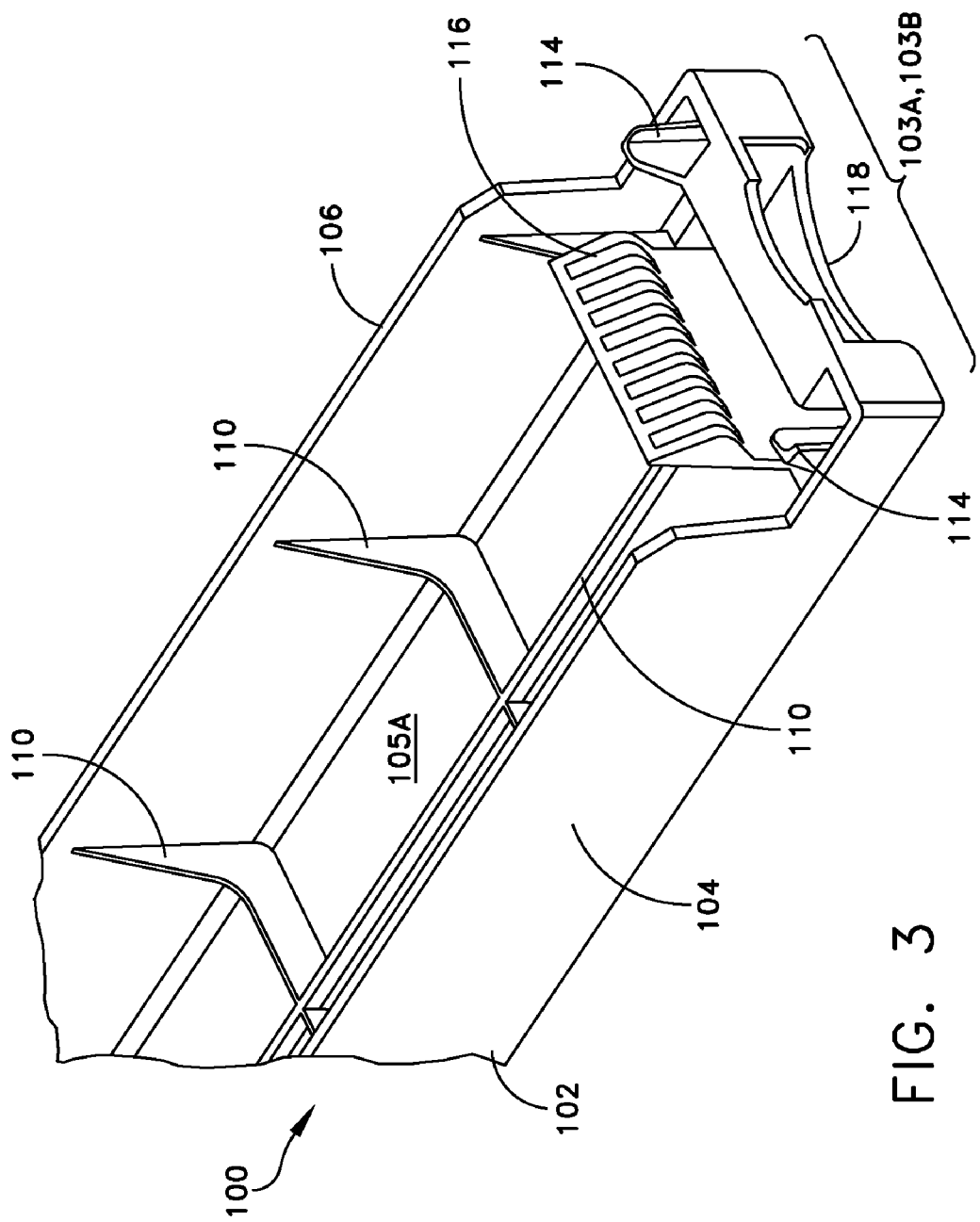
FIG. 3 is a perspective view of the rear side of one end of the blanking panel shown in FIG. 1.

Referring to FIG. 3, and with further reference to FIGS. 1 and 2, the panel body 102 includes a top wall 104, a front wall 105, and a bottom wall 106. The walls 104, 105 and 106 are configured preferably as contiguous walls to define the body 102 as a single unit. Each of the walls 104, 105 and 106 defines along its inner surface one or more ribs 110. Each rib 110 traverses at least a portion of the walls 104, 105 and 106 and is configured to help to provide rigidity and strength to the front wall 105 and at least a portion of the top and bottom walls 104 and 106.

Portions of the panel body 102 may be constructed of one or more materials suitable for imparting deflection properties to the walls 104, 105 and 106 or portions of the walls 104, 105 and 106. For instance, edge portions of the top wall 104 and the bottom wall 106 may be constructed of one or more materials that exhibit deflection properties. When a force or pressure is applied to the blanking panel 100, for instance, to insert and install the panel 100 between a pair of rack-mounted panels 100 or equipment components, or between a second blanking panel 100 and an equipment component or other type of blanking panel, the edge portions of the walls 104 and 106 deflect in response to the applied force or pressure. The deflection properties of the edge portions help to facilitate installation of the panel 100, as will be described below in more detail. The deflection properties of the edge portions also help to achieve a close fit or interface between the panel 100 and adjacent equipment components and panels to thereby create an air seal between the panel 100 and the adjacent components and panels.

Figure 4:
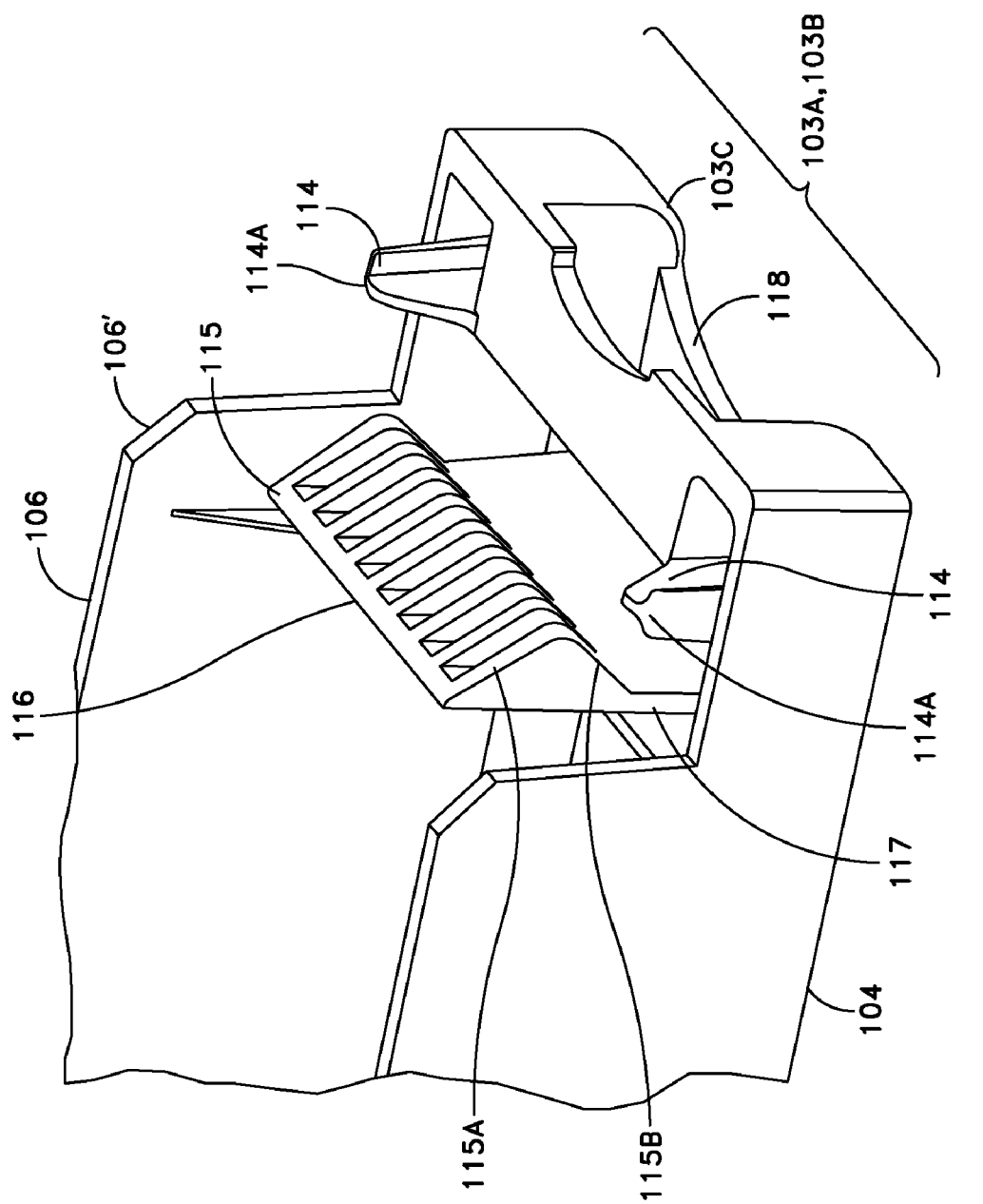
FIG. 4 is a perspective view of the end of the blanking panel shown in FIG. 3.

Referring to FIG. 4, and with further reference to FIG. 3, in one aspect of the invention, each attachment configuration 103A and 103B includes a retention tab 116 and one or more alignment pegs 114. The attachment configurations 103A and 103B are symmetrical and are constructed and arranged to permit reverse installation of the blanking panel 100 to the rack 200.

As shown in FIGS. 3 and 4, each retention tab 116 is defined along an inner surface 105A of the front wall 105 of the panel body 102. The tab 116 is configured as a raised tab extending outward from the inner surface 105A and having a tab wall 117 that terminates to a sloped flange 115.

As shown in FIGS. 3 and 4, and with further reference to FIG. 2, the one or more alignment pegs 114 are spaced and disposed along the inner surface 105A of the front wall 105 of the panel body 102. The alignment pegs 114 are disposed opposite to and in substantial alignment with one another. Each peg 114 is configured and is further disposed to permit a mounting aperture 202 defined along one of the mounting rails 201A and 201B of the rack 200 to receive at least a portion of the peg 114 where the peg 114 is aligned with an area defined by the aperture 202 and is inserted therein.

In addition, the positions of the pegs 114 help the pegs 114 to self-align with appropriate mounting apertures 202 and to mount the panel 100 in a substantially horizontal position between the rails 201A and 201B. As shown in FIGS. 2 and 3, the positions of the pegs 114 help to insure that the pegs 114 align with and insert into, for instance, only an upper mounting aperture 202 and a lower mounting aperture 202 within a given U space 202A, as shown in FIG. 2, to help to avoid misalignment and insertion of one of the pegs 114 into a middle mounting aperture 202B. The positions of the pegs 114, thereby, help to prevent the pegs 114 from coupling with the middle mounting aperture 202B and installing the panel 100 at an "off" or crooked position between the rails 201A and 201B.

The pegs 114 may be further configured such that where one of the mounting apertures 202 receives at least a portion of the peg 114, the peg 114 can engage with an area along the inner surface 203 of the rail 201A and 201B adjacent the mounting aperture 202, and/or can engage with a perimeter edge that defines the mounting aperture 202, to help to releasably secure the panel 100 to the rack 200.

Figure 5:
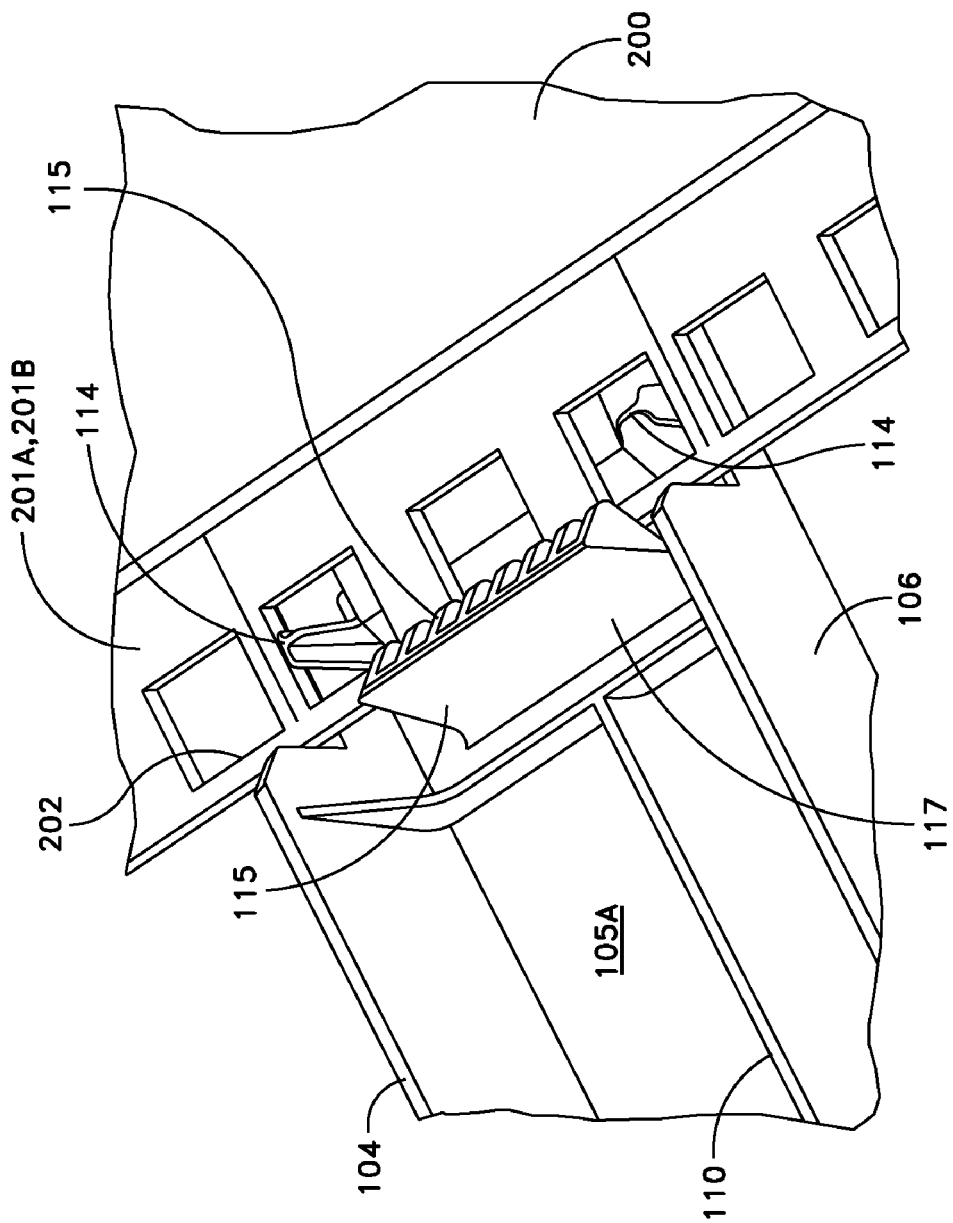
FIG. 5 is a perspective view of the rear side of one end of the blanking panel shown in FIGS. 1 and 2 mounted to a vertical mounting rail of an equipment rack.

Referring to FIG. 5, and with further reference to FIGS. 3 and 4, each alignment peg 114 and its head 114A are configured in a T-shape or configuration. The T-shape of the head 114A and the alignment peg 114 permits, for instance, a square-shaped mounting aperture 202 to receive the head 114A and at least a portion of the peg 114. In addition, the T-shape allows the head 114A and/or at least a portion of the peg 114 to lay flush with an edge of the rail 201A and 201B that serves as a perimeter defining the square-shaped aperture 202. Alternatively, the head 114A and the alignment peg 114 can be configured in a cross shape or configuration that helps to permit a circular-shaped mounting apertures 202 to receive the head 114A and at least a portion of the peg 114. In addition, the cross shape allows the head 114A and/or at least a portion of the peg 114 to lay flush with an edge of the rail 201A and 201B that serves as a perimeter defining the circular-shaped aperture 202.

The invention is not limited to the number of alignment pegs 114 of each attachment configuration 103A and 103B, and anticipates the attachment configurations 103A and 103B can include any number of alignment pegs 114 to help to align and to install the blanking panel 100 to a rack or enclosure 200. In addition, the invention is not limited to a T- or cross-shaped configuration of the heads 114A and the alignment pegs 114, and contemplates that the heads 114A and alignment pegs 114 may define any of a variety of shapes or configurations. Such shape and/or configuration of the alignment head 114A and the peg 114 may help to permit a mounting aperture 202 of a given size and shape to receive the head 114A and at least a portion of the peg 114, and may further help to permit the head 114A and/or at least a portion of the alignment peg 114 to couple to or mate with any portion of the rail 201A and 201B, as required or desired to securely and releasably install the panel 100 to the rack 200.

Still referring to FIGS. 3 thru 5, each retention tab 116 is disposed along the inner surface 105A and configured such that where the panel 100 is mounted to the rails 201A and 201B, the sloped flange 115, and/or a portion of the tab wall 117, contacts, for instance, an area along the inner surface 203 of one of the rails 201A or 201B. The retention tab 116 remains securely and releasably coupled to or mated with the inner surface 203 by friction until the retention tab 116, via an application of a pulling or outward force or pressure, is disengaged from the inner surface 203. The sloped flange 115 includes a sloped top plane 115A that serves as a lead-in to help to align and/or to couple the tab 116 with one of the rails 201A and 201B during installation. In addition, the sloped flange 115 includes a sloped bottom plane 115B below the sloped top plane 115A. The sloped bottom plane 115B is sized and is angled to help to accommodate different thicknesses of the rails 201A and 201B and to also help to accommodate minor differences in distances between the rails 201A and 201B. Configuration of the retention tab 116 thereby helps the retention tab 116 to couple to or to mate with rails 201A and 201B of difference thicknesses and distances to permit installation of the panel 100 with a variety of rack or enclosure designs.

The tab wall 117 may be constructed of one or more materials that provide the wall 117 with sufficient deflection ability to respond to a force or pressure applied to the panel 100, e.g., along the front wall 105, during installation to allow the retention tab 116 to deflect and to thereby slide past one of the rails 201A and 201B to become disposed, for instance, against an area of an inner surface 203 of the rail 201A and 201B.

The invention is not limited to a single retention tab 116 of each attachment configuration 103A and 103B as shown, for example, in FIG. 4, and envisions that each of the attachment configurations 103A and 103B may have two or more retention tabs 116 disposed, e.g., in alignment with one another, along the inner surface 105A to facilitate removable attachment of the panel 100 to the rails 201A and 201B. In addition, as will be described below in more detail with reference to FIGS. 22, 23 and 24, the invention anticipates that the attachment configurations 103A and 103B may include on or more retention hooks and other types of configurations to releasably secure the panel 100 to the rack 200.

With further reference to FIGS. 1 and 2 and FIGS. 4 and 5, the length $L_1$ between an outer edge 103C of each of the attachment configurations 103A and 103B helps to ensure that the panel 100 covers one or more mounting apertures 202 and 202B defined along one or both of the rails 201A and 201B where the panel 100 is attached to the rack 200. As noted above, covering one or more mounting apertures 202 and 202B helps to reduce or prevent mixing of hot exhaust air with cooling air, and further helps to reduce or prevent cooling air from flowing past or bypassing equipment components and thereby helps to insure cooling air is forced or drawn into the equipment components.

In addition, as shown in FIG. 2, and with further reference to FIGS. 4 and 5, the length $L_2$ of the panel body 102 helps to ensure that the panel 100 mounts between the rails 201A and 201B such that the top and the bottom walls 104 and 106 of the panel body 102 clear and fit between a pair of adjacent vertical rails 201A and 201B.

With further reference to FIG. 4, an edge portion 104' and 106' of each of the top wall 104 and the bottom wall 106 is chamfered to help to provide sufficient clearance between the walls 104 and 106 of the panel 100 and the rails 201A and 201B during installation of the panel 100 to the rack 200. The edge portions 104' and 106' further help to guide or center the panel 100 between the rails 201A and 201B, and help to protect a tip of the sloped flange 115 of the retention tab 116 during installation of the panel 100.

Figure 6:
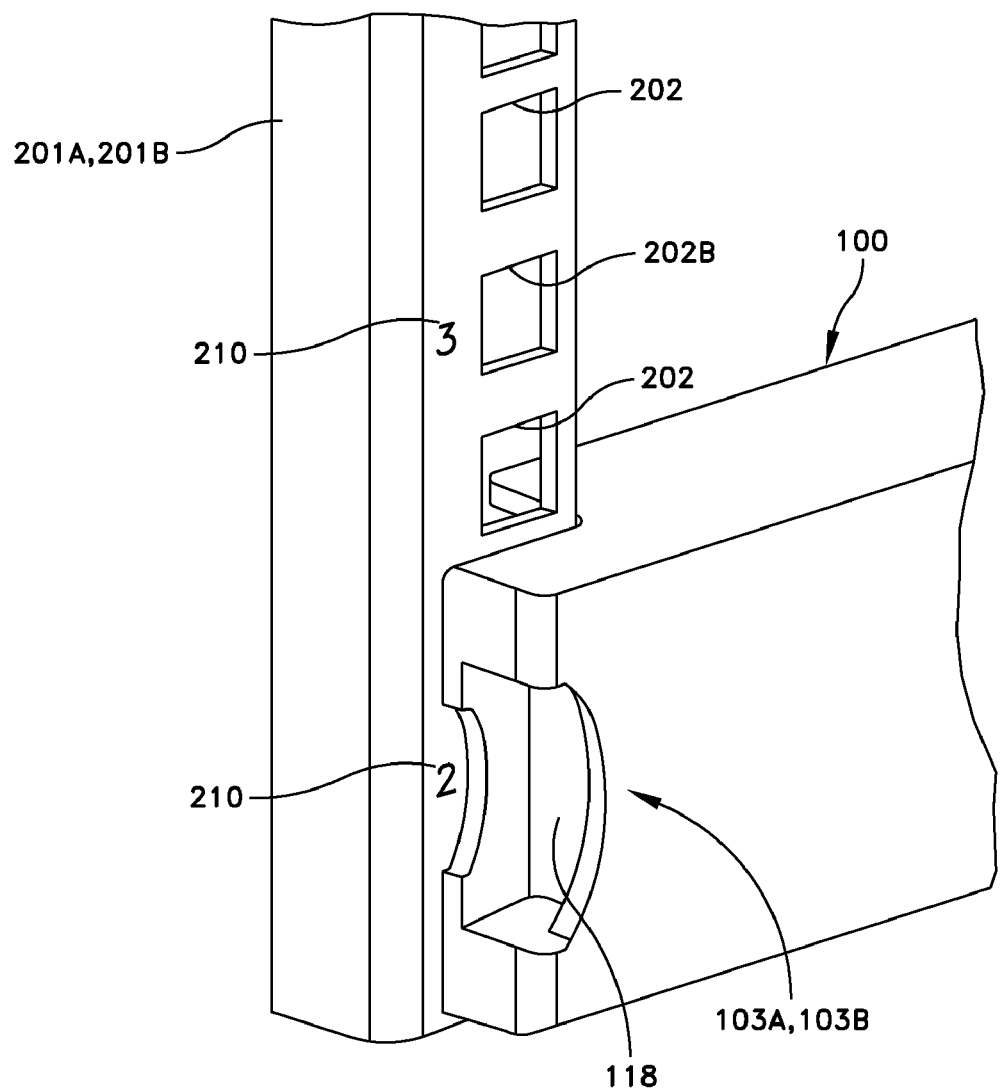
FIG. 6 is a perspective view of the front side of one end of the blanking panel shown in FIG. 5.
Figure 7:
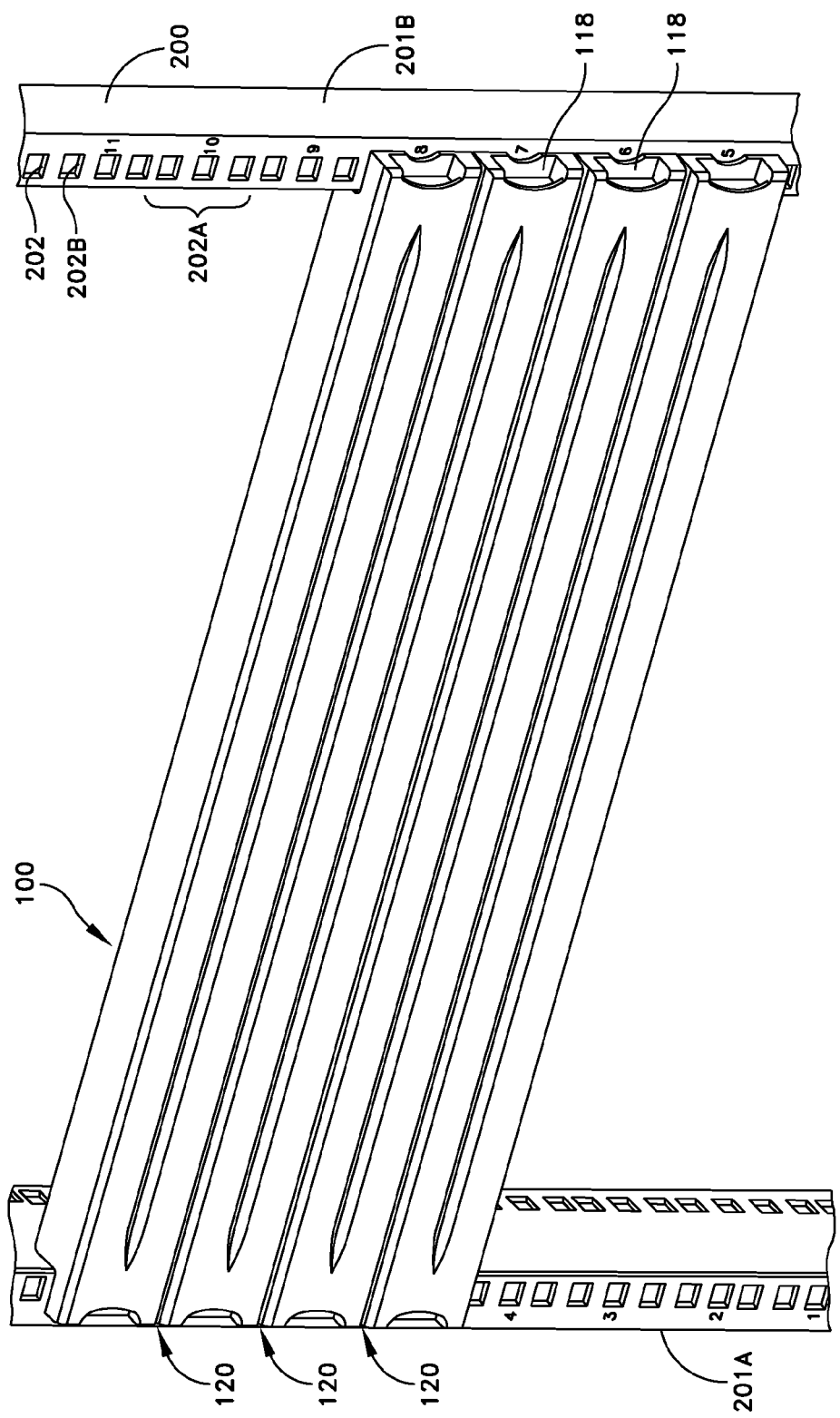
FIG. 7 is a perspective view of a multiple of the blanking panels shown in FIGS. 1 and 2 mounted to a pair of vertical mounting rails of an equipment rack.

Referring to FIG. 6, and with further reference to FIG. 4, each attachment configuration 103A and 103B may include a finger grip 118 configured for user access when the panel 100 is mounted to the rack 200. As shown in FIG. 6, each end of the attachment configuration 103A and 103B terminates at the finger grip 118. The finger grip 118 is configured to receive at least a portion of one or more fingers of a user's hand, a tool or other implement and to permit a user to remove the panel 100 from the rack 200. When a user inserts at least a portion of one or more fingers into one or both of the finger grips 118, the user can manually pull at the finger grip 118 to pull the panel 100 away from the rack 200 to disengage the retention tabs 116 from the rails 201A and 201B and thereby remove the panel 100 without the use of tools. The positions and configuration of the finger grips 118 help to eliminate the need for a user to access the panel 100 from above or below the front wall 105 or from inside the rack 200, or to otherwise use vertical movement, to attach or to remove the panel 100 from the rack 200. Without requiring access or movement vertically or from within the rack 200, the panel 100 is installed and removed without disturbing or removing equipment components and other blanking panels previously installed above and/or below the panel 100.

As shown in FIG. 6, edges of the attachment configurations 103A and 103B are further configured such that when the panel 100 is mounted to the rack 200, U height numbers 210 displayed along the mounting rails 201A and 201B are visible. Visible U height numbers 210 are useful in configuring or rearranging the rack 200 by helping to prevent errors in installing equipment components and blanking panels, and by reducing the number of panels 100 and equipment components that must be removed or relocated to configure or rearrange the rack 200. In addition, visible U height numbers 210 permit a user to readily observe the U height of the equipment area in which panels 100 and components are installed.

Figure 9:
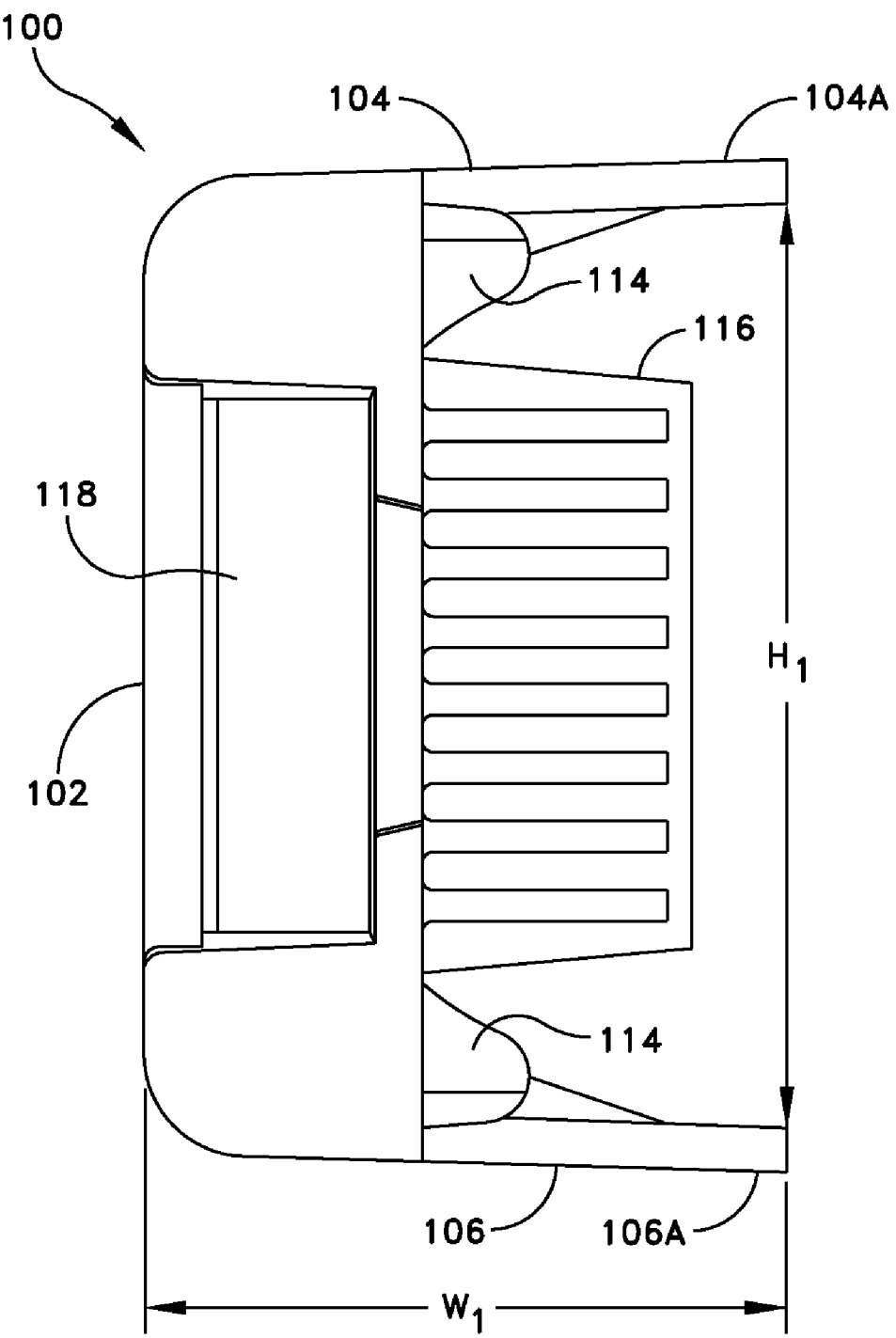
FIG. 9 is an end view of the blanking panel shown in FIGS. 1 and 2.

Referring to FIG. 9, the panel 100 may define any height $H_1$. In one aspect of the invention, the panel 100 may define a nominal U height of 1U, 2U, 3U, 4U or greater, or some fractional U thereof, along the front wall 105, while the actual height $H_1$ of the panel 100, for instance, between an edge portion 104A of the top wall 104 and an edge portion 106A of the bottom wall 106 is in excess of the actual height allowed by the EIA-310 standard. The actual height $H_1$ of the panel 100 is larger than the actual height allowed by the EIA-310 standard in order to intentionally create an interference between the panel 100, e.g., the top wall portion 104A and/or the bottom wall portion 106A, and adjacent equipment components and other types of blanking panels installed above or below the panel 100. The interference between the panel 100 and adjacent equipment components and other panels helps to form the air seal described above. For instance, a nominal 1U panel 100 may have an actual height $H_1$, as shown in FIG. 9, that is in excess of the actual height allowed by the EIA-310 standard such that the panel 100 may readily interface with an equipment component and other type of blanking panel disposed above or below the nominal 1U panel 100 when the panel 100 is installed into a 1U rack space. In another instance, where one or more nominal 1U equipment components and other types of 1U blanking panels are removed from the rack 200, the actual height $H_1$ of the panel 100 can accommodate the variances in the height of the resulting 1U spaces and can permit the panel 100 to interface with equipment components and other blanking panels installed above and below the resulting 1U rack spaces to form an air seal therebetween. (Such variances in the height of the resulting 1U rack spaces are created as a result of the differences in actual heights of different types of equipment components and blanking panels that conform to the EIA-310 standard.) Therefore, the panel 100 of the invention defines an actual height $H_1$ that is larger than or in excess of the actual height allowed by the EIA-310 standard to accommodate the differences between actual heights of equipment components and other types of blanking panels conforming to the EIA-310 standard.

Still referring to FIG. 9, and with further reference to FIGS. 8A and 8B, the top and bottom walls 104 and 106 of the panel 100 may define a depth or width $W_1$ that is sufficient to help to permit the top and bottom walls 104 and 106 to extend into the rack 200 at a sufficient depth when the panel 100 is installed into the rack 200 such that the edge portions 104A and 106A, or other areas of the top and the bottom walls 104 and 106, are disposed within the rack 200 beyond any bezel configurations or other similar perimeter edge configurations of adjacent equipment components and other types of blanking panels. The sufficient width $W_1$ of the top and bottom walls 104 and 105 helps to insure that the edge portions 104A and 106A or any other portions of the top and bottom walls 104 and 106, and any associated configurations, interface with a surface of an adjacent equipment component or other blanking panel installed above and below the panel 10 location to thereby help to form the air seal 120 therebetween.

The panel 100 preferably defines a nominal 1U height $H_1$, as described above, to provide flexibility and convenience in configuring or rearranging the rack 200. Utilizing a number of 1U panels 100 permits a user to configure or rearrange the rack 200 without difficulty. A number of 1U panels 100 permits a user to remove or install only those equipment components and blanking panels 100 necessary to reconfigure or rearrange the rack 200, and insures that the extent of vacant sections created during reconfiguration or rearrangement is minimized or eliminated. Any vacant sections that may result can be readily and easily filled in with one or more 1U panels 100. A user would no longer need to locate a number of panels that collectively have the exact height to fill in a vacant section. The nominal 1U height of the panel 100 along with the tool-less installation facilitated by the attachment configurations 103A and 103B simplifies rack configuration and rearrangement by minimizing the time and difficulty associated with removing and installing equipment components and blanking panels 100 into the rack 200.

Referring to FIGS. 8A, 8B and 9, a cross-sectional perspective view, a cross-sectional view and an end view of portions of the panel 100 are shown. As shown in FIGS. 8A and 8B, when the blanking panel 100 is installed adjacent to a second blanking panel 100' according to the invention, the edge portion 104A of the top wall 104 of the blanking panel 100 is positioned flush with at least the edge portion 106A of the bottom wall 106 of the second adjacent blanking panel 100'. An interface of the edge portions 104A and 106A helps to create an air seal 120 between the blanking panel 100 and the second blanking panel 100'. Similarly, the portions 104A and 106A of the top and bottom walls 104 and 106 may be configured to interface with or to lay flush against an area of a surface of an adjacent equipment component, other type of blanking panel or an end-frame disposed along a top or a bottom of the rack 200 to create the air seal 120 therebetween.

With further reference to FIG. 9, the top wall 104 and the bottom wall 106 extend outward from the front wall 105 at a slight slope or angle. In one aspect of the invention, the top wall 104 and the bottom wall 106 are joined or connected to the front wall 105 at an angle in excess of 90 degrees. The top wall 104, the front wall 105 and the bottom wall create a C-shaped channel. The slope or angle of the top wall 104 and the bottom wall 106 help the walls 104 and 106 to serve as lead-ins to help to guide and to center the panel 100 between the rails 201A and 201B of the rack 200. In addition, the extent of the slope or angle of the top wall 104 and the bottom wall 106 helps to determine how much the walls 104 and 106 can constrict when inserted and installed into the rack 200 between adjacent equipment components and blanking panels. In other words, the slope or angle of the top wall 104 and the bottom wall 106 helps assist the flexure of the top and the bottom walls 104 and 106 when the panel 100 is inserted and installed into the rack 200. In addition, the slope or angle of the top and bottom walls 104 and 106 helps to localize the interference between the panel 100 and adjacent equipment components and blanking panels to contact with the top and the bottom edge portions 104A and 106A.

The edge portions 104A and 106A of the top and bottom walls 104 and 106 may be constructed of one or more materials suitable for providing the portions 104A and 106A with deflection properties such that the top and bottom walls 104 and 106 can deflect, flex or compress in response to insertion of the panel 100 adjacent to an installed panel 100, an equipment component, another type of blanking panel or a top or bottom end-frame to facilitate installation of the panel into the rack 200. Such deflection properties also help to permit the edge portions 104A and 106A of the panel 100 to form an interface with or to lay flush against the edge portions 104A and 106A of an adjacent second blanking panel 100', or an area of a surface of an adjacent equipment component, other type of blanking panel or end-frame to thereby create the air seal 120.

As noted above, the blanking panel 100 may preferably have a nominal 1U height with an actual height $H_1$ in excess of the height allowed by the EIA-310 standard to accommodate undersizing of the actual heights of equipment components and other types of blanking panels conforming to the EIA-310 standard. The deflection properties exhibited by the one or more materials with which the edge portions 104A and 106A are constructed help the panel 100 to accommodate such undersizing and to form the air seal 120 at the interface of the nominal 1U panel 100 and equipment components and other types of blanking panels.

With further reference to FIG. 1 and FIGS. 8A and 8B, the air seal 120 the blanking panel 100 may form extends along a length $L_2$ of the panel 100, and may help to reduce or prevent flow of air between the panel 100 and a second panel 100', an equipment component, another type of blanking panel or an end-frame of the rack 200 disposed adjacent to the panel 100. In addition, as noted above, the air seal 120 helps to reduce or prevent hot exhaust air from mixing with cooling air within the rack 200, and further helps to insure that cooling air is forced or drawn into the equipment components.

Alternatively, the entire top wall 104 and the entire bottom wall 106 of the panel 100 may be constructed of one or more materials suitable for imparting deflection properties to the walls 104 and 106. Such materials help the walls 104 and 106 deflect, flex or compress in response to an application of force or pressure that facilitates installation of the panel 100 and helps the walls 104 and 105 form the air seal 120, as described above.

In instances where the edge portions 104A and 106A or the entire top and bottom walls 104 and 106 are constructed of one or more materials different from the material(s) used to construct other portions of the panel body 102, the panel 100 may be formed by a two-shot molding process, or other similar process, method or technique well known in the art, to co-mold the panel 100. For instance, the panel body 102, including the front wall 105 and the top and bottom walls 104 and 106, is formed using one or more first materials, while each edge portion 104A and 106A is thereafter finished by overmolding one or more second material(s) along edges of the walls 104 and 106. In this case, one or more suitable material(s) used for co-molding the panel 100 include, but are not limited to, rubber, plastic, and any combinations of such materials.

Still referring to FIGS. 8A and 8B and FIG. 9, the edge portions 104A and 106B of the walls 104 and 106, or the entire top wall 104 and the entire bottom wall 106, may be constructed of the same material used to construct other portions of the panel body 102. In these instances, the edge portion 104A and 106B or the entire wall 104 and 106 defines a thickness and possesses a design that helps to permit the edge portions 104A and 106B or the walls 104 and 106 to deflect, flex or compress during installation, as described above, while an outer perimeter of the edge portions 104A and 106A remains substantially straight. Additionally, as shown in FIGS. 3 and 5, the ribs 110, e.g., transverse or longitudinal ribs 110, defined in the inner surfaces of the walls 104 and 106 and the front wall 105 may be constructed of one or more materials that help to provide support and rigidity to the edge portions 104A and 106A and/or the walls 104 and 106.

Further, the blanking panel 100 may be constructed of one or more materials suitable for achieving and maintaining low manufacturing costs and/or low shipping costs. Suitable materials may also include one or more materials that produce the panel 100 with a durable, scratch-resistant and lightweight configuration.

Suitable materials for constructing the blanking panel 100, the edge portions 104A and 106A, and the top and bottom walls 104 and 106 and for imparting any of the qualities or properties described above include, but are not limited to, rubber, plastic, e.g., acrylonitrile butadiene styrene (ABS™), polyethylene, polypropylene, metals, e.g., aluminum, and any combinations of such materials.

The blanking panel 100 according to the invention is preferably constructed as a single unit via any process, method or technique well known in the art. In one aspect of the invention, the panel 100 may be constructed as a single unit of, for instance, one or more plastics, e.g., acrylonitrile butadiene styrene (ABS™), and formed by an injection molding process.

Figure 10A:
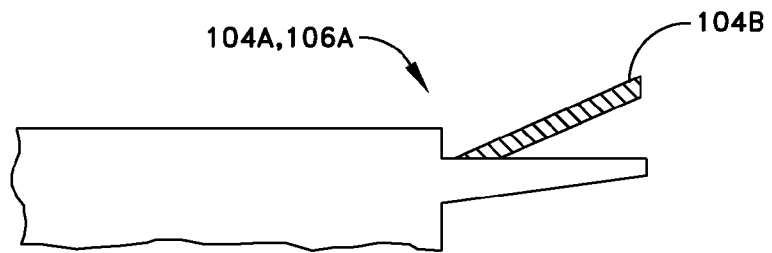
FIG. 10A is a cross-sectional view of another aspect of the invention providing a blanking panel with a portion of a top wall or a bottom wall including a tab configuration.
Figure 10B:
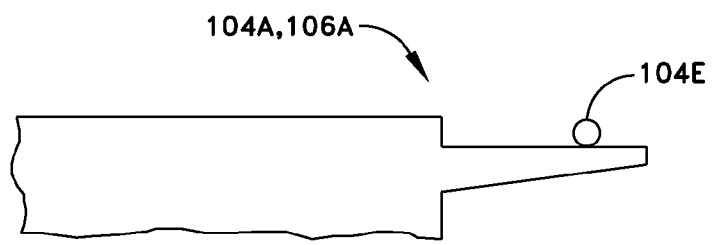
FIG. 10B is a cross-sectional view a further aspect of the invention providing a blanking panel with a portion of a top wall or a bottom wall including a gasket configuration.
Figure 10C:
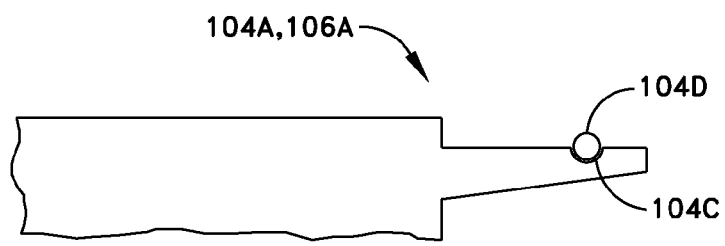
FIG. 10C is a cross sectional view of still another aspect of the invention providing a blanking panel with a top wall or a bottom wall including a recess and a gasket configuration.

Referring to FIGS. 10A-10C, cross-sectional views of other aspects of the top and bottom walls 104 and 106 of the blanking panel 100 according to the invention are shown. In these instances, the top and bottom walls 104 and 106 have one or more configurations disposed along the edge portions 104A and 106A to help to create an interference and to thereby form an interface with equipment components and blanking panels installed within the rack 200 above and below the panel 100 location. The configurations may be constructed of one or more different materials from those materials used to construct the remaining portions of the panel body 102. The remaining portions of the panel body 102, e.g., the front wall 105, the top wall 104 and the bottom wall 106, may be constructed of one or more materials suitable for imparting rigidity and strength to the panel body 102, while the configurations may be constructed of one or more materials that help to impart deflection properties to such configurations such that the configurations may deflect, flex or compress during installation of the panel 100 and form the air seal 120 thereafter.

As shown in FIG. 10A, the edge portions 104A and 106A of the top and bottom walls 104 and 106 may include a tab 104B to help to provide deflection ability and flexibility, and to help to form the air seal 120 at an interface between the tab 104B and adjacent equipment components and other blanking panels. The edge portions 104A and 106A and/or the tabs 104B may be constructed of the same or different material(s) as the remainder of the panel body 102 by one or more processes, methods or techniques well known in the art.

As shown in FIG. 10B, the edge wall portions 104A and 106A may include a gasket 104E disposed along one surface of each edge portion 104A and 106A configured to help to form an interface and thereby the air seal 120 between the panel 100 and adjacent equipment components and other blanking panels.

As shown in FIG. 10C, the edge wall portions 104A and 106A may define a recess 104C along one surface that can be configured to accept a gasket 104D such that the gasket 104D of each edge portion 104A and 106A helps to form an interface and thereby the air seal 120 between the panel 100 and adjacent equipment components and other blanking panels.

Figure 10D:
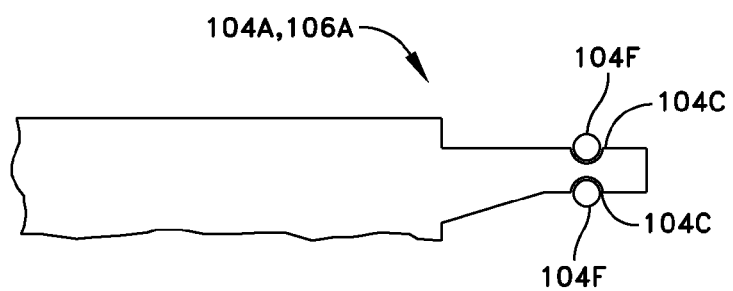
FIG. 10D is a cross sectional view of a further aspect of the invention providing a blanking panel with a top wall or a bottom wall including an O-ring configuration.

As shown in FIG. 10D, the recess 104C may be defined along both surfaces of each edge portion 104A and 106A and may be configured to accept an O-ring 104F such that the O-ring 104F of each edge portion 104A and 106A forms an interface with adjacent equipment component and blanking panels to thereby create the air seal 120.

Those of ordinary skill in the art can appreciate that the invention is not limited to the configurations as shown in and described with reference to FIGS. 10A thru 10D, and envisions that the blanking panel 100 and, in particular, the edge portions 104A and 106A may include or define any of a variety of configurations and features that enable the blanking panel 100 to interface with adjacent equipment components and blanking panels to create the air seal 120 as described.

Referring to FIGS. 10E thru 10I, other aspects of the invention provide blanking panels 180, 185, 190, 195 and 199 that have similar attachment configurations 103A and 103B and other features, as described above with reference to the blanking panel 100 shown in and described with reference to FIGS. 1-10C, but are constructed of one or more materials and/or define alternative configurations that help such blanking panels 180, 185, 190, 195 and 199 to deflect, flex and/or compress in response to a force or pressure applied to the panels 180, 185, 190, 195 and 199 during installation and use. As described above, such physical properties facilitate installation of the panels 180, 185, 190, 195 and 199 and formation of the air seal 120 between the panels 180, 185, 190, 195 and 199 and adjacent equipment components and other blanking panels when the panels 180, 185, 190, 195 and 199 are installed into the rack 200.

Figure 10E:
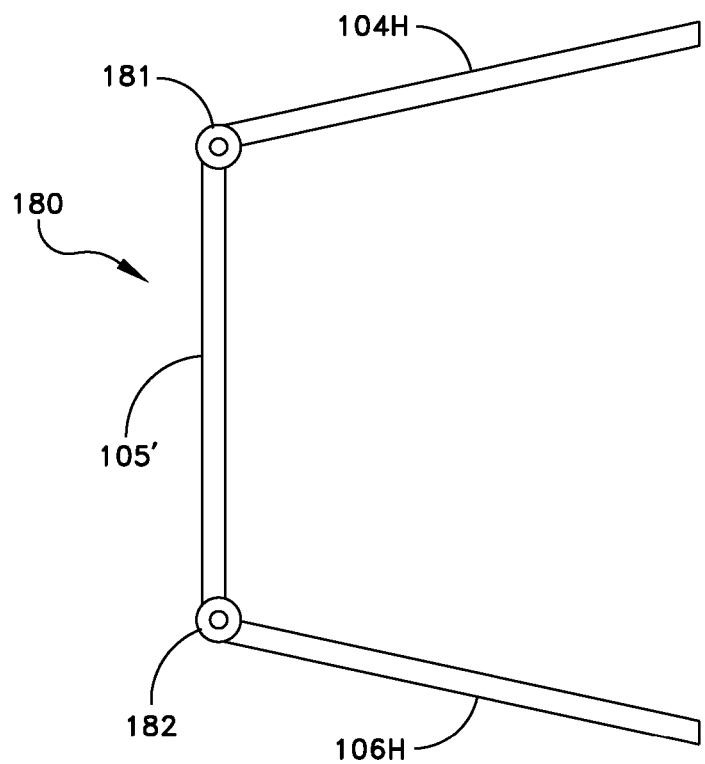
FIG. 10E is a cross sectional view of a blanking panel according to yet another aspect of the invention.

As shown in FIG. 10E, in another aspect, the invention provides the blanking panel 180 including a hinged intersection 181 of a front wall 105' and a top wall 104H and a hinged intersection 182 of the front wall 105' and a bottom wall 106H. For instance, the hinged intersections 181 and 182 may be configured as mechanical hinges, each including a spring (not shown) configured to bias the walls 104H and 106H outwardly to thereby create a tension when the top and bottom walls 104H and 106H interface with adjacent equipment components and other types of blanking panels when the panel 180 is installed into the rack 200. The hinged intersections 181 and 182 respond to a force or pressure applied to the panel 180 when the panel 180 is installed into the rack 200 and inserted between adjacent equipment components and/or other blanking panels mounted above or below the panel 180 location. In response to such force or pressure, at least the top wall 104H and the bottom wall 106H pivot inwardly about the hinged intersections 181 and 182. Such deflection of the top and the bottom walls 104H and 106H helps to facilitate installation of the panel 180 and formation of the air seal 120 at an interface between at least a portion of the top and the bottom walls 104H and 106H and a surface of adjacent equipment components and/or other panels. In this instance, the top and the bottom walls 104H and 106H may be constructed of one or more materials that provide strength and rigidity to the top and bottom walls 104H and 106H.

Figure 10F:
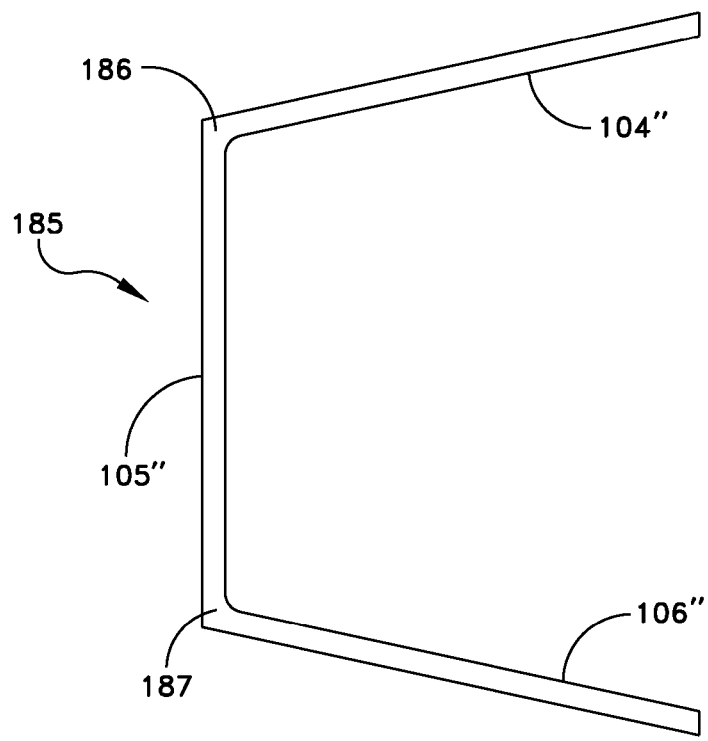
FIG. 10F is a cross sectional view of a blanking panel according to a further aspect of the invention.

Referring to FIG. 10F, in another aspect, the invention provides the blanking panel 185 including a first localized area of flexibility 186 along the intersection of a top wall 104" and a front wall 105" and a second localized area of flexibility 187 along the intersection of the front wall 105" and a bottom wall 106". The first and the second localized areas 186 and 187 may be constructed of one or more materials and may define a configuration and/or a thickness, e.g., a reduced cross section, to impart deflection properties or flexibility to the first and the second localized areas 186 and 187 and to localize the flexure of the walls 104" and 106". The walls 104" and 106" can deflect or flex along the localized areas 186 and 187 in response to a force or pressure applied to the panel 185 when the panel 185 is installed into the rack 200 and inserted between equipment components and/or other blanking panels. The deflection properties and/or flexibility of the first and the second localized areas 186 and 187 further help at least a portion of the top and the bottom walls 104" and 106" to interface with adjacent equipment components and blanking panels to form the air seal 120 therebetween.

Figure 10G:
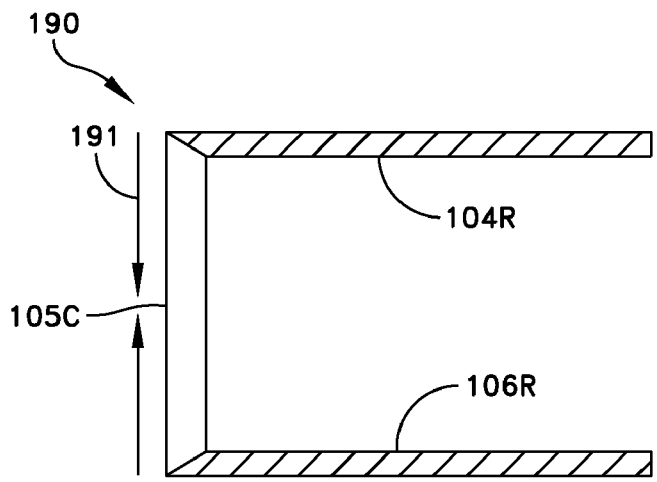
FIG. 10G is a cross sectional view of a blanking panel according to another aspect of the invention.

Referring to FIG. 10G, in a further aspect, the invention provides the blanking panel 190 including a top wall 104R constructed of one or more materials to configure the top wall 104R as a rigid wall, and including a bottom wall 106R disposed substantially parallel to the top wall 104R and similarly constructed of one or more materials to configure the bottom wall 106R as a rigid wall. A front wall 105C is constructed of one or more materials that permit the front wall 105C to collapse and/or to compress in response to an application of force or pressure, and to extend or flex in an opposite orientation in response to the removal of such force or pressure to thereby restore the front wall 105C to its original position or configuration. When the panel 190 is installed into the rack 200 and between adjacent equipment components and other blanking panels, the front wall 105C responds to the force or pressure applied to the rigid top and bottom walls 104R and 106R, when the panel 190 interfaces with equipment components and other blanking panels disposed above and/or below the panel 190 location, by compressing or collapsing inwardly as shown by arrows 191 in FIG. 10G. The collapsible or compressible construction and configuration of the front wall 105C helps to facilitate installation of the panel 190 and helps to permit the panel 190 to interface with adjacent equipment components and other blanking panels to form the air seal 120 therebetween.

Figure 10H:
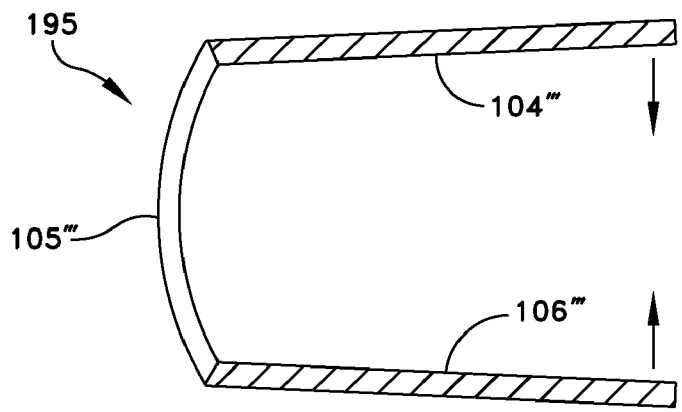
FIG. 10H is a cross sectional view of a blanking panel according to another aspect of the invention.

Referring to FIG. 10H, in still another aspect, the invention provides the blanking panel 195 including a front wall 105''' constructed of one or more materials that help to permit the front wall 105''' to deflect outwardly in response to application of a force or pressure to the panel 195, and further including a top wall 104''' and a bottom wall 106''' each constructed of one or more rigid materials. When the panel 195 is installed into the rack 200 and between adjacent equipment components and/or other blanking panels disposed above and/or below the panel 195 location, the front wall 105''' bulges or bows horizontally and outwardly, as shown by arrow 196 in FIG. 10H, in response to a force or pressure exerted on the panel 195. The outward deflection, e.g., outward horizontal bowing or bulging, of the front wall 105''' helps to facilitate installation of the panel 195 and formation of the air seal 120 at the interface of the panel 195 and adjacent equipment components and other blanking panels.

Figure 10I:
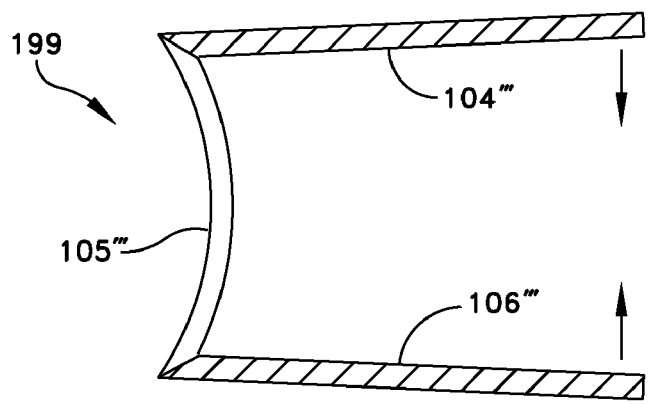
FIG. 10I is a cross sectional view of a blanking panel according to still a further aspect of the invention.

Referring to FIG. 10I, in yet another aspect, the invention provides the blanking panel 199 that is similar to the blanking panel 195 shown in FIG. 10H with the front wall 105''' constructed and arranged of one or more materials that help to permit the front wall 105''' to deflect inwardly in response to application of a force or pressure to the panel 199. When the panel 199 is installed into the rack 200 and between adjacent equipment components and/or other blanking panels disposed above and/or below the panel 199 location, the front wall 105''' bulges or bows horizontally and inwardly, as shown by arrow 197 in FIG. 10I, in response to a force or pressure exerted on the panel 199. The inward deflection, e.g., inward horizontal bowing or bulging, of the front wall 105''' helps to facilitate installation of the panel 199 and formation of the air seal 120 at the interface of the panel 199 and adjacent equipment components and other blanking panels.

Installation of the blanking panel 100 will now be described with reference to FIGS. 1 and 2 and FIG. 5. To install the blanking panel 100 to the pair of adjacent mounting rails 201A and 201B of the rack 200, the panel 100 is held before the mounting rails 201A and 201B and the top wall 104 and the bottom wall 106 are placed between the mounting rails 201A and 201B to help to center the panel 100 to the left and right of the rails 201A and 201B. The panel 100 is then pushed forward to move the panel 100 inward toward the rack 200 and to place the top sloped plane 115A of each retention tab 116 against or in contact with one of the rails 201A and 201B. The top and the bottom walls 104 and 106 further help to serve as lead-ins or guides to assist in maintaining the sloped top plane 115A of each retention tab 116 in contact with the rails 201A and 201B.

A force or pressure is then applied to the front wall 105 of the panel 100 to push the panel 100 further inward toward the rack 200 such that each top sloped plane 115A begins to deflect and each tab wall 117 begins to bias inward. Each top sloped plane 115, as a result, begins to slide past one of the rails 201A or 201B in response to continued application of force or pressure. Once each top sloped plane 115A begins to slide past one of the rails 201A and 201B, each alignment peg 114 proximate to the top sloped plane 115A substantially aligns with one of the mounting apertures 202 defined in one of a pair of opposite and horizontally aligned U spaces along the rails 201A and 201B. Each peg 114, as noted above, is positioned to serve as a lead-in such that at least a portion of each peg 114 may insert, for instance, into only the upper or the lower mounting aperture 202 within a given U space to help to avoid insertion of any of the pegs 114 into the middle aperture 202B to thereby prevent crooked installation of the panel 100. As each top sloped plane 115A continues to slide past one of the rails 201A and 201B, at least a portion of each alignment peg 114 moves into one of the mounting apertures 202.

In alternative configurations of the alignment pegs 114, each alignment peg 114 may be have a configuration and may define a length sufficient to permit each alignment peg 114 to be visible during installation to thereby serve as a visible lead-in to help to align each peg 114 with one of a pair of opposite and horizontally aligned U spaces. In addition, each peg 114 would help to permit at least a portion of each peg 114 to be inserted into one of the mounting apertures 202 to thereby mate the pegs 114 with the rails 201A and 201B either before or simultaneously with mating of the retention tabs 116 with the rails 201A and 201B.

Continuing the discussion of the installation of the panel 100 from above, each top sloped plane 115A, as noted, continues to slide past one of the rails 201A and 201B until each retention tab 116 couples to or mates with a surface of the rail 201A and 201B.

In particular, each bottom sloped plane 115B of the retention tab 116, and/or optionally a portion along each tab wall 117, may contact or otherwise engage with an area of an inner surface 203 of the rail 201A and 201B. Friction between the retention tab 116 and the rail 201A and 201B helps to releasably secure the panel 100 to the rack 200 until an application of an outward or pulling force or pressure is applied to the panel 100 to disengage the retention tabs 116 with the rails 201A and 201B.

Alternatively, installation of the blanking panel 100 can be achieved by first mounting one end of the panel 100 to one of the rails 201A or 201B and then mounting the opposing end of the panel 100 to the other rail 201A or 201B. In this case, the retention tabs 116 of one of the attachment configurations 103A and 103B may be attached first to one of the rails 201A and 201B. The sloped bottom planes 115B of the tabs 116, and/or portions of the tab walls 117, contact an area along the inner surface 203 of the rail 201A and 201B and the panel 100 is then rotated about the retention tabs 116 while it is in contact with the inner surface 203. The rotation of the panel 100 permits the retention tabs 116 of the other attachment configuration 103A and 103B to contact and to slide past the other rail 201A and 201B in response to a force or pressure applied to the blanking panel 100 to push the panel 100 toward the rack 200. The retention tabs 116 of the other attachment configuration 103A and 103B contact the inner surface 203 of the other rail 201A and 201B to removably secure the panel 100 to the rack 200. Because only one retention tab 116 deflects at a time, this alternative approach to installing the panel 100 uses less force or pressure to engage the retention tabs 116 with the rack 200.

To remove the blanking panel 100 from the rack 200, sufficient force or pressure to pull the panel 100 away from the rack 200 is applied to the panel 100 via the finger grips 118 such that the retention tabs 116 are dislocated from the rails 201A and 201B and the panel 100 is thereby released from the rack 200. A user may employ one or both of the finger grips 118 to pull the panel 100 to remove either one end at a time or both ends at once to release the panel 100. Where one end of the panel 100 is initially removed from one rail 201A or 201B, the other end of the panel 100 is removed by rotating the panel 100 about the retention tabs 116 coupled to or mated with the other rail 201A and 201B to disengage all the tabs 116 from the rails 201A and 201B and thereby release the panel 100 from the rack 200.

The invention is not limited to the aspects shown in and described with reference to FIGS. 1-10F, and anticipates other aspects of the blanking panel according to the invention. In particular, further aspects of a panel body, attachment configurations and an air seal are envisioned.

Figure 12:
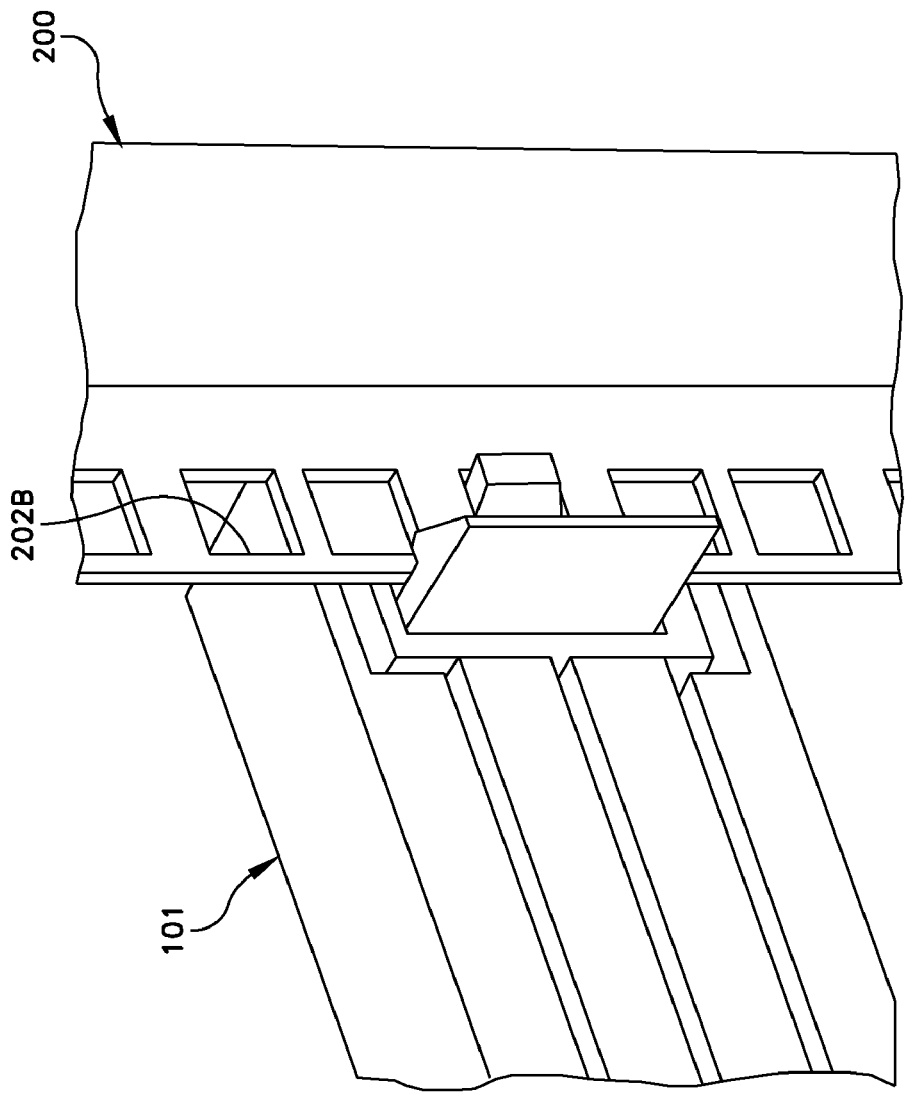
FIG. 12 is a perspective view of the rear side of the end of the blanking panel shown in FIG. 10 mounted to a vertical mounting rail of an equipment rack.

Referring to FIGS. 11A, 11B, 12 and 13, in another aspect, the invention provides a blanking panel 101 includes attachment configurations 103A and 103B having a single alignment peg 214 and a single retention tab 216. The panel 101 of this configuration is installed and removed from the rack 200 as described above with reference to FIGS. 1 and 2 and FIG. 5. As shown in FIG. 12, the alignment peg 214 is disposed and is configured such that one of the mounting apertures 202B defined along the mounting rails 201A and 201B of the rack 200 receives at least a portion of the peg 214. The retention tab 216 is disposed and is configured such that when the panel 101 is mounted to the rack 200, the tab 216 couples to or mates with an area of the inner surface 203 of the rails 201A and 201B, as shown in FIG. 12. Friction between the tabs 216 and the inner surface 203 helps to releasably secure the panel 101 to the rack 200. In addition, each attachment configuration 103A and 103B may further define a finger grip 218 to permit removal of the panel 101 from the rack 200.

Figure 13:
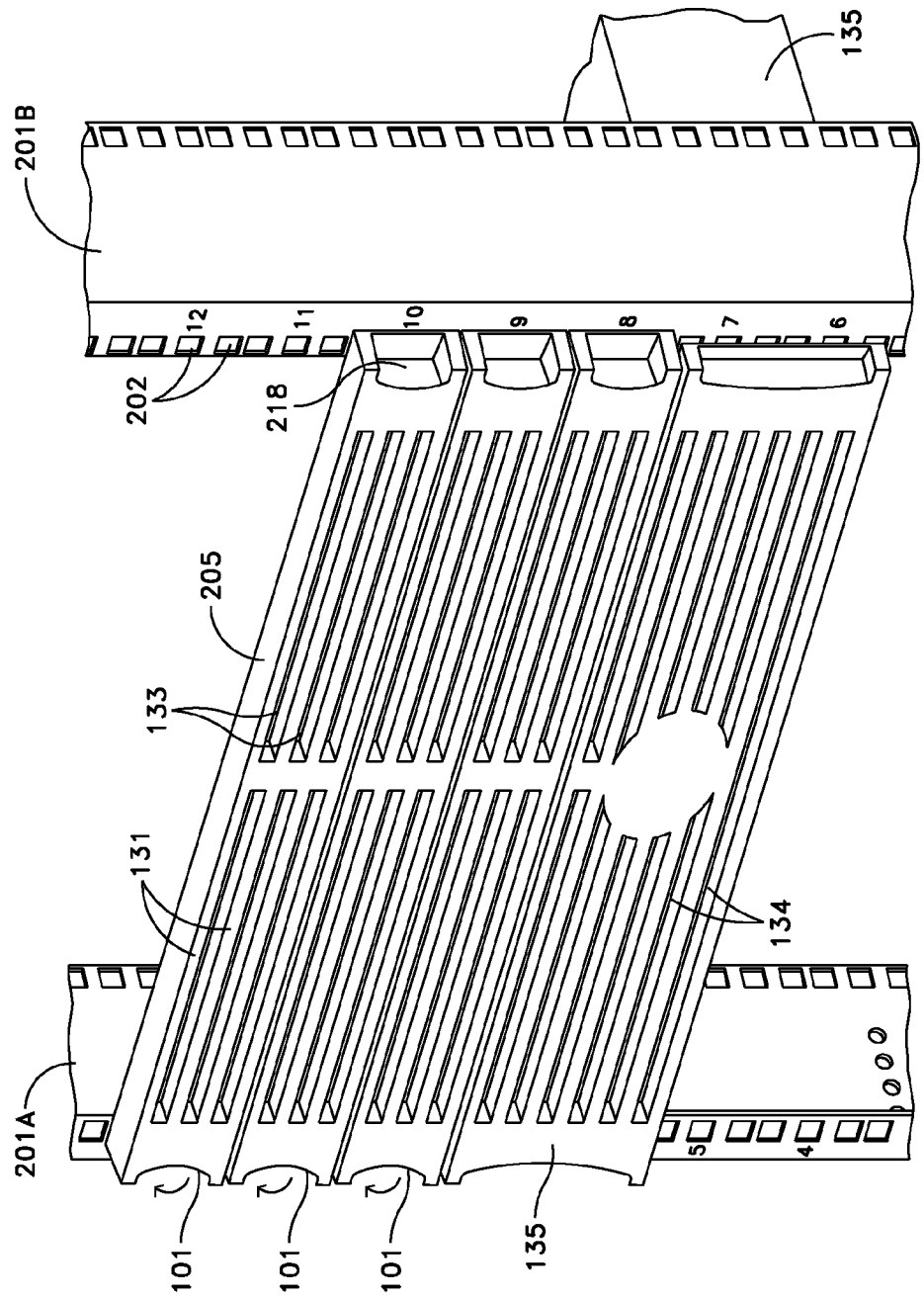
FIG. 13 is a perspective view of a multiple of the blanking panels shown in FIG. 10 mounted with an equipment component installed between a pair of vertical mounting rails of a rack.

As shown in FIGS. 11A and 13, the front wall 205 of the panel 101 may have an external appearance that is relatively consistent with an external appearance of one or more equipment components with which the panel 101 is rack-mounted. The rack-mounted panel 101 includes along its front wall 205 a plurality of ribs 131 and a plurality of depressions 133 that are similar to, for instance, the configurations of intake vents 134 defined along a front panel 135 of an equipment component mounted in the rack 200 along with the panel 101. The external appearance of a plurality of the panels 101 helps to provide a simple and uniform appearance of the mix of panels 101 and equipment components 135 along the rack 200. In addition, the external appearance of the panels 101 helps to minimize the appearance of gaps between the panel 101 and an adjacent equipment component, as well as between pairs of panels 101. As a result, the aesthetic appearance of the rack configuration can be improved.

The invention is not limited to the configurations along the front walls 205 of the panels 101 as shown in FIGS. 11A and 13, and envisions other configurations along the front wall 205 of the panel 101 to help to achieve an external appearance that is similar to or relatively consistent with an external appearance of equipment component(s) with which one or more of the panels 101 are rack-mounted.

Referring to FIGS. 14-17, in still a further aspect of the invention, a blanking panel 101B includes attachment configurations 103A and 103B having two retention tabs 416 disposed along an inner surface 405A of a front wall 405 and at each terminal end 402A and 402B of a panel body 402. As shown in FIGS. 15 and 16, each retention tab 416 includes a tab wall 417 extending from the inner surface 405A at a terminal end 402A and 402B and terminating into a sloped flange 415. The sloped flange 415 helps to serve as a lead-in to insert at least a portion of each retention tab 416 into one of the mounting apertures 202 of the rack 200 during installation. The retention tabs 416 are spaced such that at least a portion of each tab 416 aligns with an area defined by one of the mounting apertures 202. In addition, each retention tab 416 is spaced from the other retention tab 416 of each attachment configuration 103A and 103B to help to permit the panel 101B to mount to a variety of different equipment rack or enclosure designs having mounting apertures 202 with different configurations, shapes and dimensions.

Figure 17:
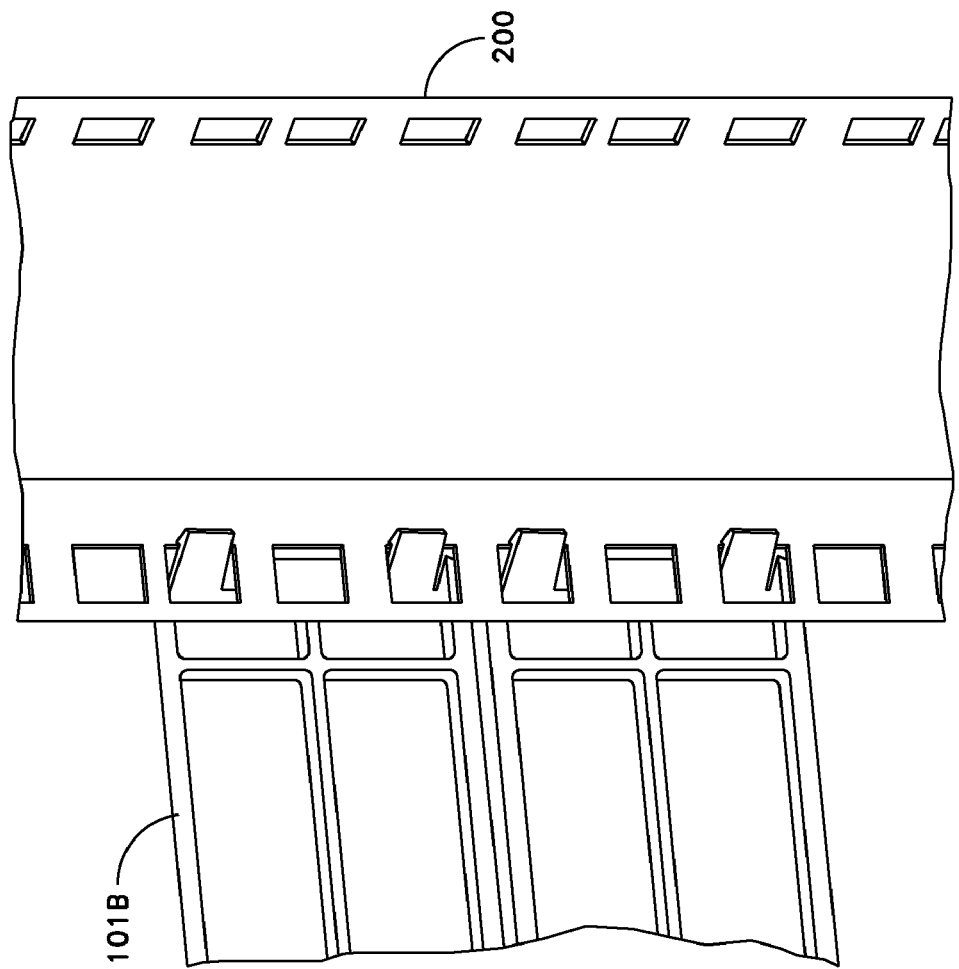
FIG. 17 is a perspective view of the rear sides of two blanking panels shown in FIG. 14 mounted to a vertical mounting rail of an equipment rack.

As shown in FIG. 17, the panel 101B is installed to the rack 200 by inserting at least a portion of each retention tab 416 into one of the mounting apertures 202. Where the panel 101B is horizontally mounted between the rails 201A and 201B, at least the tab wall 417 rests or biases against a perimeter edge that defines the mounting aperture 202, as shown by arrows 204 in FIG. 17. Friction between the retention tabs 416 and the perimeter edges of the mounting apertures 202 helps to releasably secure the panel 101B to the rack 200. To install the panel 101B, each retention tab 416 is substantially aligned with an area of one of the mounting apertures 202 and an end-user applies a force or pressure to the panel 103 to push the panel 101B forward toward the rack 200 such that at least a portion of each tab 416 inserts into one of the mounting apertures 202 and at least a portion of the tab wall 417 couples to or mates with the perimeter edge of the mounting aperture 202.

With further reference to FIG. 16, the attachment configurations 103A and 103B further define a finger grip 432 along each of the terminal ends 402A and 402B of the panel 101B. Each terminal end 402A and 402B and/or each finger grip 432 is configured and is constructed of one or more materials that permit the terminal end 402A and 402B and/or the finger grip 432 to respond to an inward force or pressure that a user applies using, for instance, one or more fingers, a tool or other implement. The terminal end 402A and 402B and/or the finger grip 432 deflects or flexes inward in response to the application of force or pressure to dislocate the retention tabs 416 from the rails 201A and 201B and to thereby release the panel 101B from the rack 200.

Referring to FIGS. 18 and 19, in yet another aspect of the invention, a blanking panel 101C includes attachment configurations 103A and 103B comprised of a depression 140 defined along an inner surface 505A of a front wall 505 and two retention tabs 542 disposed within the depression 140. Each retention tab 542 includes a tab wall 517 extending upward from the inner surface 505A and a sloped flange 515. As shown in FIG. 19, the sloped flange 515 of one of the retention tabs 542 slopes downward, while the sloped flange 515 of the other retention tabs 542 slopes upward. The retention tabs 542 are spaced from one another such that the tabs 542 accommodate different configurations, shapes and dimensions of the mounting apertures 202 of the rack 200 to permit the panel 104 to mount to a number of different types of equipment rack or enclosure designs. The panel 101C is installed to the rack 200 as described above with reference to FIGS. 14-17.

Referring to FIGS. 20-23, in another aspect of the invention, a blanking panel 101D includes each attachment configuration 103A and 103B having a retention tab 652 and a hook 650 disposed along an inner surface 605A of a front wall 605 of the panel 101D. As shown in FIGS. 22 and 23, the retention tab 652 includes a tab wall 617 extending outward from the inner surface 605A of the front wall 605 and terminating into an angled flange 615. The hook 650 extends from the inner surface 605A and is constructed as a hook- or L-shaped configuration. To install the panel 101D, each hook 650 is inserted into one of the mounting apertures 202 of the rack 200 such that an inner surface of the hook 650 couples to or mates with a perimeter edge of the mounting aperture 202. The panel 101D is then rotated about the hooks 650 either in an upward or a downward orientation, depending upon whether the hooks 650 are positioned above or below the retention tabs 652 during installation, and while the hooks 650 are coupled to or mated with the perimeter edges of the mounting apertures 202 in which the hooks 650 are inserted. Each retention tab 652 is thereby brought in substantial alignment with one of the mounting apertures 202 disposed within a same U space as the mounting apertures in which the hooks 650 have been inserted. An application of force or pressure is then applied to the panel 101D to push the retention tabs 652 into the mounting apertures 202 such that the retention tabs 652 couple to or mate with an area of the inner surface 230 of the rails 201A and 201B. Friction between the retention tabs 652 and the inner surface 230 of the rails 201A and 201B help to releasably secure the panel 101D to the rack 200.

Figure 24:
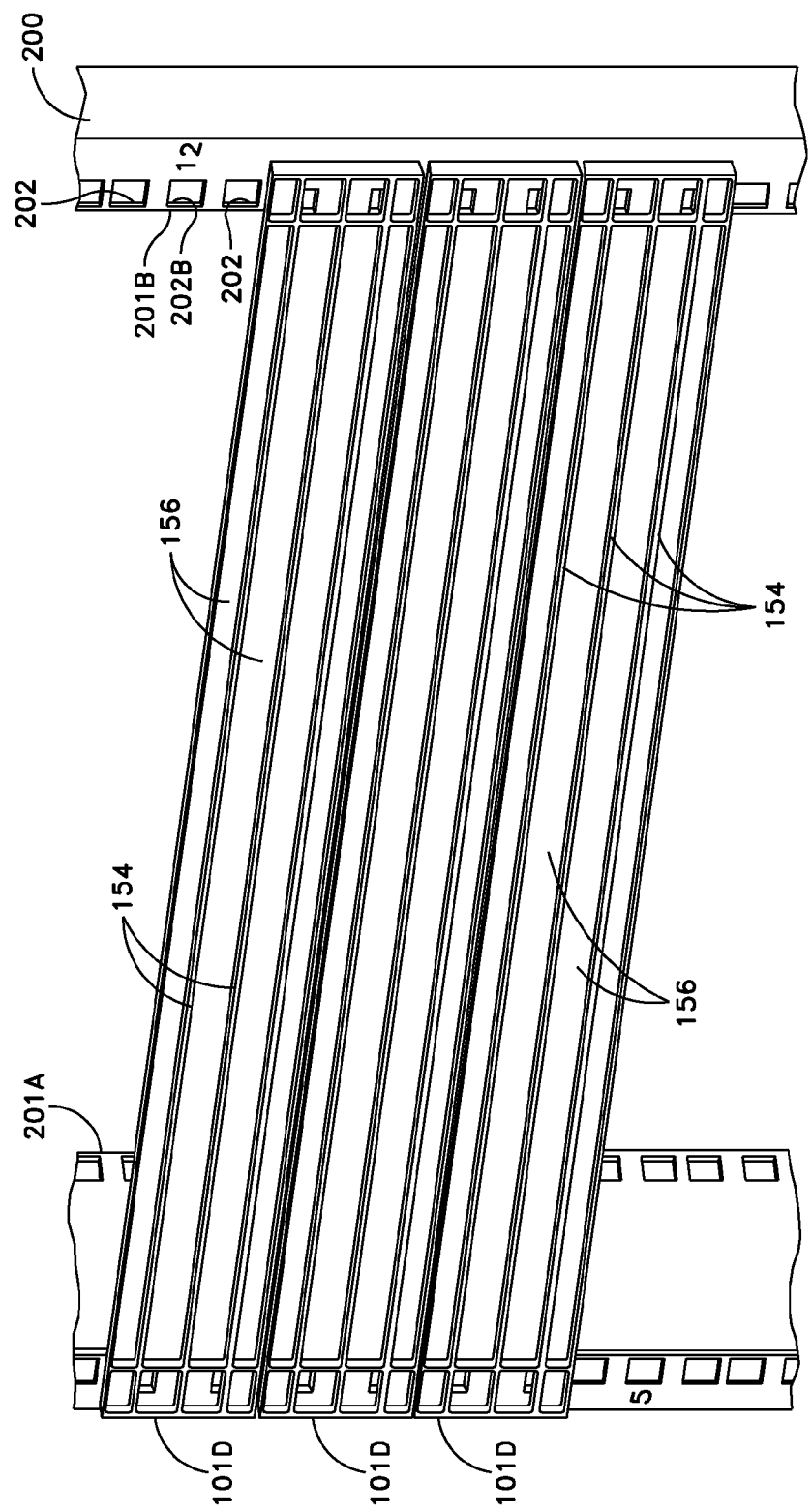
FIG. 24 is a perspective view of a multiple of the blanking panels shown in FIG. 20 mounted to a pair of vertical mounting rail of an equipment rack.

Referring to FIGS. 20 and 24, the front wall 605 of the panel 101D shown in FIG. 20 may include a plurality of ribs 154 and/or a plurality of depressions 156 to provide strength and rigidity to the panel 101D. In addition, the ribs 154 and/or depressions 156 provide an external surface appearance of the panel 101D that is similar to or relatively consistent with one or more external configurations along front walls or panels of equipment components with which the panel 101D is rack-mounted. The external appearance of the panel 101D helps to provide a simple and uniform overall appearance of a mix of panels 101D and equipment components and/or other blanking panels along the rack 200 and to minimize the appearance of gaps between the panel 101D and equipment components.

Other embodiments are within the scope of the appended claims. For example, the attachment configurations 103A and 103B can include a release mechanism to release the blanking panel 100 from the rack 200 as an alternative, or in addition to, the finger grip 118, 218, 318 and 432. Such a release mechanism may include a spring-biased or other type of mechanism.

In addition, the attachment configurations 103A and 103B may be constructed and arranged to have disposed thereon one or more connectors or fasteners, e.g., male/female type connectors or snap-fasteners, that are configured and disposed to couple to or to mate with corresponding fasteners disposed along or mounted to pairs of rails 201A and 201B of the rack 200 to facilitate tool-less installation and removal of the panel 100. For instance, the attachment configurations 103A and 103B may include alignment pegs 114 constructed and arranged as male type connectors or fasteners. Female type connectors or fasteners may be disposed along or attached to the mounting apertures 202 of the rails 201A and 201B such that each male type connector or fastener of the panel 100 can be inserted into one of the mounting apertures 202 in which a female type connector or fastener is disposed or attached to mate with the female type connector or fastener to thereby releasably install the panel 100 to the rack 200.

Further, the attachment configurations 103A and 10B may be constructed and arranged to include hook and loop type fasteners along the panel 100 that are configured and disposed to mate with corresponding hood and loop type fasteners disposed along and in alignment with U boundaries to permit tool-less installation and removal of the panel 100.

Multiple blanking panels 100 may be constructed and arranged as a single unit by any method, process or technique well known in the art, e.g., a molding process, such that two or more panels 100 are formed as a series or a group of panels 100 having a certain U height and provided as a single unit. The unit of panels 100 may include a number of panels 100 joined to one another. In one configuration, the panels 100 may be joined via a molded bridge between the portion 104A of the top wall and the portion 106A of the bottom wall 106. The single unit of panels 100 serves as a rack-mountable blanking system for filling in vacant sections of the rack 200, e.g., having large U heights. The single unit of panels 100 further serves as a continuous air seal that eliminates gaps and provides a physical obstruction that helps to reduce or prevent mixing of hot exhaust air with cooling air. In addition, the continuous air seal also helps to reduce or prevent cooling air from flowing past or bypassing equipment components and to thereby insure cooling air is forced or drawn into the equipment components. Once rack-mounted, one or more panels 100 may thereafter be removed from the single unit system, e.g., breaking or cutting the molded bridge between one or more pairs of adjacent panels 100, as is necessary to accommodate installation, removal and/or rearrangement of equipment components within the rack 200. The molded bridge can define a thickness to permit the bridge to be broken or cut. Individual panels 100 once separated from the unit can be reused and installed to the rack 200, for instance, to fill-in a vacant section having a 1U height.

In other configurations, multiple blanking panels 100 may be constructed and arranged as a single unit wherein each of a number of panels 100 is joined to another adjacent panel via interlocking configurations or interlocking mechanisms. For instance, an edge of the top wall 104 and an edge of the bottom wall 106 of the panel 100 may define a first interlocking configuration that may couple to or mate with a second interlocking configuration defined in another blanking panel 100 and complementary to the first interlocking configuration. When the first interlocking configuration couples to or mates with the second interlocking configuration the respective blanking panels 100 are joined. In particular, in one configuration, the first interlocking configuration may be disposed along the edge of the top wall 104, while the second interlocking configuration may be disposed along the edge of the bottom wall 106 such that the top wall 104 of a first blanking panel 100 may join with the bottom wall 105 of a second blanking panel 100. The invention is not limited to the configurations described herein and envisions other types of interlocking configurations may be defined in or disposed along the edges, or other areas, of the top and bottom walls 104 and 105 to interlock panels 100 to form a single unit and thereby a continuous air seal along at least a portion of the rack 200 where such joined panels 100 are installed.

Interlocking mechanisms to join two or more blanking panels 100 can include, for instance, a magnetic strip disposed along each of the top wall 104 and the bottom wall 106, e.g., adjacent an edge of each wall 104 and 106, such that when the magnetic strips of two blanking panels are proximate one another, a magnetic force between the strips causes the strips to mate and to thereby join the panels 100. Other interlocking mechanisms can include, as noted above, hook and loop type of mechanisms and can include a pair of complementary interlocking mechanisms. A pair of complementary interlocking mechanisms may include a first mechanism disposed along a first blanking panel 100 having a first configuration that mates with or couples to a second interlocking mechanism disposed along a second blanking panel 100 having a second configuration complementary to the first configuration to cause the first and the second configurations to mate and interlock and to thereby join two the first and the second panels 100. In this case, each blanking panel 100 can include the first interlocking mechanism, e.g., along the top wall 104, and the second interlocking mechanism, e.g., along the bottom wall 106. Such interlocking mechanisms as described here not only join two blanking panels 100 but also help to form the air seal 120 as described above. A number of blanking panels 100 joined with interlocking mechanisms in this manner forms a single unit configured to help to provide a continuous air seal along a portion of the rack 200 where such joined panels 100 are installed. The invention is not limited to those interlocking mechanisms described herein and anticipates other types of interlocking mechanisms may be used to join blanking panels 100 and thereby help to form a continuous air seal along portions of the rack 200.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A method of filling in one or more vacant sections of an equipment rack or enclosure of the type including at least one pair of spaced apart vertically extending mounting rails each configured with a plurality of U-spaced openings to support rack-mounted equipment, the method comprising:

providing a blanking panel having an elongated body constructed and arranged to install the blanking panel in a substantially horizontal orientation between the pair of mounting rails of an equipment rack or enclosure, the elongated body including a first side wall and a second opposing side wall, a front wall connecting the first side wall with the second side wall in such a manner that the first side wall, the front wall and the second side wall create a C-shaped channel, wherein the first and second side walls are of equal length, at least a portion of the first side wall and at least a portion of the second side wall being constructed to interface with a second blanking panel installed within the equipment rack adjacent to and above or below the blanking panel to form an air seal there between and constructed of at least one material that permits the portions of the first and second side walls to one of deflect, flex and compress in response to an application of force;

aligning a first attachment configuration disposed along a first end of the elongated body with at least one U-spaced opening of a first rail of the pair of mounting rails, and aligning a second attachment configuration disposed along a second end of the elongated body with at least one U-spaced opening of a second rail of the pair of mounting rails;

moving the blanking panel between the pair of mounting rails to center the blanking panel between the pair of mounting rails and to dispose the first attachment configuration flush with the first mounting rail and to dispose the second attachment configuration flush with the second mounting rail; and applying sufficient force to the blanking panel to cause each attachment configuration to engage a surface of its respective mountain rail, and to interface at least a portion of the elongated body flush with a portion of one of an adjacent second blanking panel and in adjacent equipment component to form an air seal therebetween.

2. A method of filling in one or more vacant sections of an equipment rack of the type including at least one pair of spaced apart vertically extending mounting rails each configured with a plurality of U-spaced openings to support rack-mounted equipment, the method comprising:

providing an elongated body constructed and arranged to be disposed in a substantially horizontal orientation between a pair of mounting rails of an equipment rack, the elongated body including a first side wall and a second opposing side wall, a front wall connecting the first side wall with the second side wall in such a manner that the first side wall, the front wall and the second side wall create a C-shaped channel, wherein the first and second side walls are of equal length, at least a portion of the first side wall and at least a portion of the second side wall being constructed to interface with a second blanking panel installed within the equipment rack adjacent to and above or below the blanking panel to form an air seal there between and constructed of at least one material that permits the portions of the first and second side walls to one of deflect, flex and compress in response to an application of force;

inserting an elongated body into a vacant section of the equipment rack or enclosure;

deflecting at least a portion of an upper wall of the elongated body and deflecting at least a portion of a lower wall of the elongated body in response to an application of force, wherein the application of force results from inserting the elongated body between one of an equipment component and a blanking panel installed in the equipment rack above and below the vacant section; and forming an air seal between the deflected portion of the upper wall and the deflected portion of the lower wall of the elongated body.

* * * * *